(12) United States Patent
Hwang et al.

(10) Patent No.: US 11,501,711 B2
(45) Date of Patent: Nov. 15, 2022

(54) DISPLAY DEVICE

(71) Applicant: Samsung Display Co., Ltd., Yongin-si (KR)

(72) Inventors: Young In Hwang, Suwon-si (KR); Sung Ho Kim, Suwon-si (KR); Eung Taek Kim, Hwaseong-si (KR); Joo Hyeon Jo, Hwaseong-si (KR); Jung Mi Choi, Seoul (KR); Seong Baik Chu, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/906,688

(22) Filed: Jun. 19, 2020

(65) Prior Publication Data

US 2021/0090494 A1 Mar. 25, 2021

(30) Foreign Application Priority Data

Sep. 19, 2019 (KR) .......................... 10-2019-0115124

(51) Int. Cl.
*G09G 3/30* (2006.01)
*G09G 5/00* (2006.01)
*G09G 3/325* (2016.01)
*G09G 3/3291* (2016.01)
*G09G 3/3266* (2016.01)

(52) U.S. Cl.
CPC ........... *G09G 3/325* (2013.01); *G09G 3/3266* (2013.01); *G09G 3/3291* (2013.01)

(58) Field of Classification Search
CPC .. G09G 3/3258; G09G 3/2092; G09G 3/3291; G09G 3/3266; G09G 2310/0283; G09G 2320/0693; G09G 2310/062; G09G 2320/0233; G09G 3/325; G09G 3/3283; G09G 2320/064

See application file for complete search history.

(56) References Cited

U.S. PATENT DOCUMENTS

| | | | |
|---|---|---|---|
| 2010/0053041 A1* | 3/2010 | Abe | G09G 3/325 348/333.01 |
| 2013/0002616 A1* | 1/2013 | Kim | H01L 27/1214 345/204 |
| 2018/0151126 A1* | 5/2018 | Jeong | G09G 3/3266 |
| 2019/0147796 A1* | 5/2019 | Rha | G09G 3/3291 345/691 |

FOREIGN PATENT DOCUMENTS

| | | |
|---|---|---|
| KR | 10-2005-0119367 A | 12/2005 |
| KR | 10-2016-0002337 A | 1/2016 |

* cited by examiner

*Primary Examiner* — Md Saiful A Siddiqui
(74) *Attorney, Agent, or Firm* — Lewis Roca Rothgerber Christie LLP

(57) ABSTRACT

A display device includes: a (k−1)-th scan line and a k-th scan line which are parallel to each other; a j-th data line which crosses the (k−1)-th scan line and the k-th scan line; and a subpixel connected to the (k−1)-th scan line, the k-th scan line, and the j-th data line, wherein the subpixel includes: a driving transistor configured to control a driving current flowing from a first electrode thereof to a second electrode thereof according to a data voltage applied to a first gate electrode thereof, the driving transistor having a second gate electrode connected to the (k−1)-th scan line; and a light emitting element configured to emit light according to the driving current.

16 Claims, 17 Drawing Sheets

DISPLAY DEVICE

CROSS REFERENCE TO RELATED APPLICATION

The present application claims priority to and the benefit of Korean Patent Application No. 10-2019-0115124, filed on Sep. 19, 2019, in the Korean Intellectual Property Office, the content of which is hereby incorporated by reference in its entirety.

BACKGROUND

1. Field

Aspects of some example embodiments of the present disclosure relate to a display device.

2. Description of the Related Art

With progression of an information-oriented society, consumer demand for display devices for displaying images has increased in various forms. For example, a display device may be utilized in various electronic devices such as smartphones, digital cameras, laptops, navigation systems, and smart televisions. A display device may be a flat panel display device such as a liquid crystal display device, a field emission display device, an organic light emitting display device, or the like. Among such flat panel display devices, organic light emitting display devices include a light emitting element that allows each pixel of a display panel to emit light by itself such that the organic light emitting display device is able to display an image even without a backlight unit that provides light to the display panel.

An organic light emitting display device may include a plurality of pixels, and each of the plurality of pixels may include a light emitting element, a driving transistor configured to adjust the amount of driving current supplied from a power line to the light emitting element according to a voltage of a gate electrode, and a scan transistor configured to supply a data voltage of a data line to the gate electrode of the driving transistor in response to a scan signal of a scan line. In this case, when black luminance is displayed and then white luminance is displayed, because a current between a drain and a source of the driving transistor may rise stepwise due to the hysteresis characteristic of the driving transistor, the white luminance of the pixel may also rise stepwise.

The above information disclosed in this Background section is only for enhancement of understanding of the background and therefore the information discussed in this Background section does not necessarily constitute prior art.

SUMMARY

Aspect of some example embodiments of the present disclosure include a display device capable of compensating for a threshold voltage of a driving transistor and while also minimizing or reducing a difference in white luminance of pixels that may occur due to a stepwise rise of current between a drain and a source of the driving transistor due to the hysteresis characteristic of the driving transistor when black luminance is displayed and then white luminance is displayed.

Additional characteristics and features of some example embodiments of the present disclosure will be set forth in the description which follows, and in part will be apparent from the description, or may be learned by practice of the inventive concepts.

According to some example embodiments of the present disclosure, a display device includes: a (k−1)-th scan line and a k-th scan line which are parallel to each other; a j-th data line which crosses the (k−1)-th scan line and the k-th scan line; and a subpixel connected to the (k−1)-th scan line, the k-th scan line, and the j-th data line. The subpixel includes: a driving transistor configured to control a driving current flowing from a first electrode thereof to a second electrode thereof according to a data voltage applied to a first gate electrode thereof, the driving transistor having a second gate electrode connected to the (k−1)-th scan line; and a light emitting element configured to emit light according to the driving current.

According to some example embodiments, the display device may further comprise an initialization voltage line to which an initialization voltage is applied. The subpixel may further include a first transistor configured to be turned on by a (k−1)-th scan signal of the (k−1)-th scan line, the first transistor connecting the first gate electrode of the driving transistor and the initialization voltage line to each other.

According to some example embodiments, the subpixel may further include: a second transistor configured to be turned on by a k-th scan signal of the k-th scan line, the second transistor connecting the first electrode of the driving transistor and the j-th data line to each other; a third transistor configured to be turned on by the k-th scan signal, the third transistor connecting the first gate electrode of the driving transistor to the second electrode of the driving transistor; and a fourth transistor configured to be turned on by the k-th scan signal, the fourth transistor connecting a first electrode of the light emitting element and the initialization voltage line to each other.

According to some example embodiments, the display device may further comprise: a k-th light emission line parallel to the (k−1)-th scan line and the k-th scan line; and a first driving voltage line to which a first driving voltage is applied. The subpixel may further include: a fifth transistor configured to be turned on by a k-th light emission signal of the k-th light emission line, the fifth transistor connecting the first electrode of the driving transistor and the first driving voltage line to each other; and a sixth transistor configured to be turned on by the k-th light emission signal, the sixth transistor connecting the second electrode of the driving transistor and the light emitting element to each other.

According to some example embodiments, the display device may further comprise an initialization voltage line to which an initialization voltage is applied. During a first period in which the initialization voltage may be applied to the first gate electrode of the driving transistor, a first level voltage of a (k−1)-th scan signal may be applied to the second gate electrode.

According to some example embodiments, during the first period, the first level voltage of the (k−1)-th scan signal may be lower than the initialization voltage.

According to some example embodiments, during the first period, a voltage difference between the second gate electrode and the first electrode of the driving transistor may be lower than a voltage difference between the first gate electrode and the first electrode of the driving transistor.

According to some example embodiments, during a second period in which a data voltage of the j-th data line may be applied to the first gate electrode of the driving transistor, a second level voltage of a (k−1)-th scan signal of the (k−1)-th scan line may be applied to the second gate electrode.

According to some example embodiments, during the second period, the second level voltage of the (k−1)-th scan signal may be higher than the data voltage.

According to some example embodiments, during the second period, a voltage difference between the second gate electrode and the first electrode of the driving transistor may be higher than a voltage difference between the first gate electrode and the first electrode of the driving transistor.

According to some example embodiments, during a third period in which the light emitting element emits light according to the driving current of the driving transistor, a second level voltage of a (k−1)-th scan signal of the (k−1)-th scan line may be applied to the second gate electrode.

According to some example embodiments, during the third period, a voltage difference between the second gate electrode and the first electrode of the driving transistor may be higher than a voltage difference between the first gate electrode and the first electrode of the driving transistor.

According to some example embodiments, the display device may further comprise a first connection electrode which connects the (k−1)-th scan line and the second gate electrode of the driving transistor to each other.

According to some example embodiments, the first connection electrode may be on the same layer as the second gate electrode of the driving transistor According to some example embodiments, the display device may further comprise at least one insulating film between the (k−1)-th scan line and the first connection electrode.

According to some example embodiments, the at least one insulating film may include: a buffer film on the first connection electrode and the second gate electrode of the driving transistor; and a gate insulating film on the first electrode of the driving transistor.

According to some example embodiments, the (k−1)-th scan line may be on the gate insulating film.

According to some example embodiments, the (k−1)-th scan line may be connected to the first connection electrode via a first connection contact hole passing through the buffer film and the gate insulating film.

According to some example embodiments, the display device may further comprise an initialization voltage line to which an initialization voltage is applied. The subpixel further may includes: a first transistor having a gate electrode connected to the (k−1)-th scan line, a first electrode connected to the initialization voltage line, and a second electrode connected to the first gate electrode of the driving transistor; and a second connection electrode which connects the second electrode of the first transistor and the first gate electrode of the driving transistor to each other.

According to some example embodiments, the first connection electrode and the second connection electrode may overlap each other.

It is to be understood that both the foregoing general description and the following detailed description are merely examples and explanatory, and are intended to provide further explanation of the subject matter of the present disclosure as claimed, and equivalents thereof.

BRIEF DESCRIPTION OF THE DRAWINGS

The accompanying drawings, which are included to provide a further understanding of the present disclosure and are incorporated in and constitute a part of this specification, illustrate aspects of some example embodiments of the present disclosure, and together with the description serve to explain the subject matter of the present disclosure.

DETAILED DESCRIPTION

Figure 1:
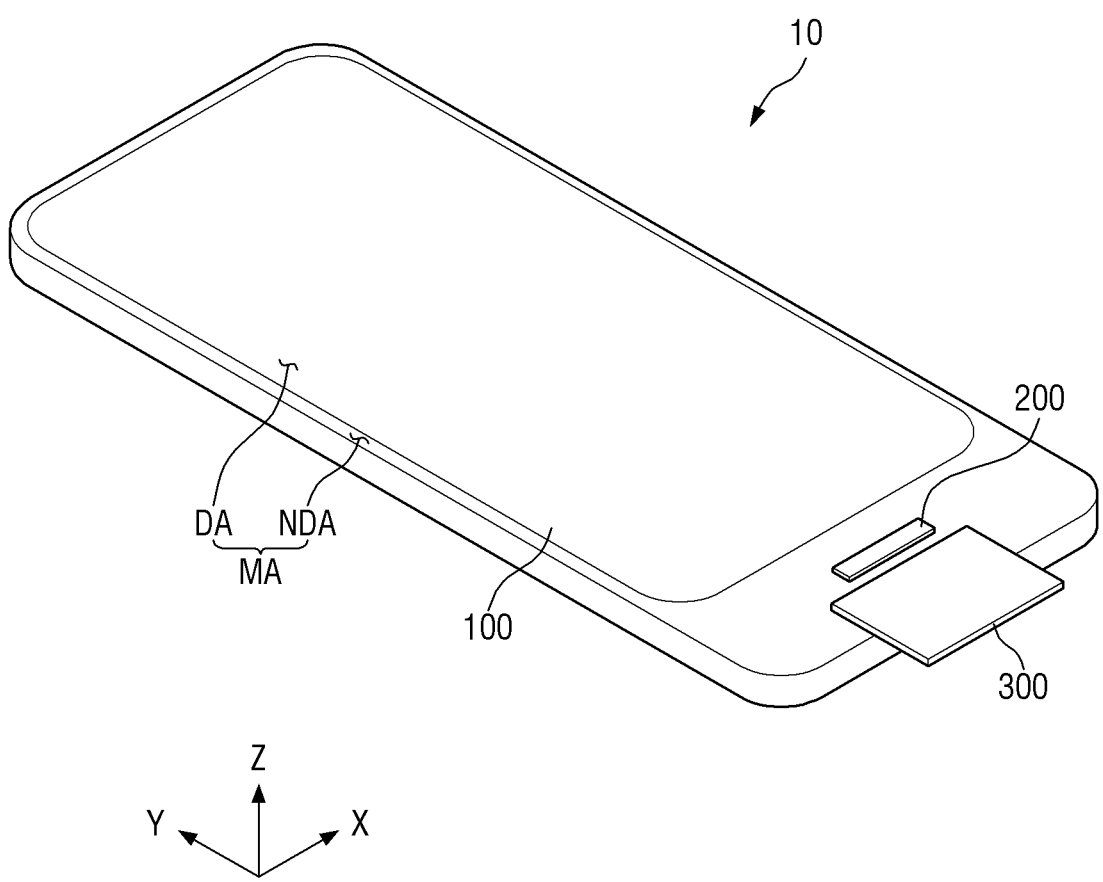
FIG. 1 is a perspective view illustrating a display device according to some example embodiments.

In the following description, for the purposes of explanation, numerous specific details are set forth in order to provide a more thorough understanding of various example embodiments of the present disclosure. As used herein "embodiments" are interchangeable words that are non-limiting examples of devices or methods employing one or more of the inventive concepts disclosed herein. It is apparent, however, that various example embodiments may be practiced without these specific details or with one or more equivalent arrangements. In other instances, various structures and devices, whose description are not needed in order to enable a person having ordinary skill in the art to understand embodiments according to the present disclosure, may be shown in block diagram form in order to avoid unnecessarily obscuring various example embodiments. Further, various example embodiments may be different, but do not have to be exclusive. For example, specific shapes, configurations, and/or characteristics of an example embodiment may be utilized or implemented in another example embodiment without departing from the subject matter of the present disclosure.

Unless otherwise specified, the illustrated example embodiments are to be understood as providing example features of varying detail of some ways in which the subject matter of the present disclosure may be implemented in practice. Therefore, unless otherwise specified, the features, sensor devices, modules, layers, films, panels, regions, and/or aspects, etc. (hereinafter individually or collectively referred to as "elements"), of the various embodiments may be otherwise combined, separated, interchanged, and/or rearranged without departing from the subject matter of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless otherwise specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc., may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, sensor devices, and/or groups thereof, but do not preclude the presence or addition of one or more other features, integers, steps, operations, elements, sensor devices, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
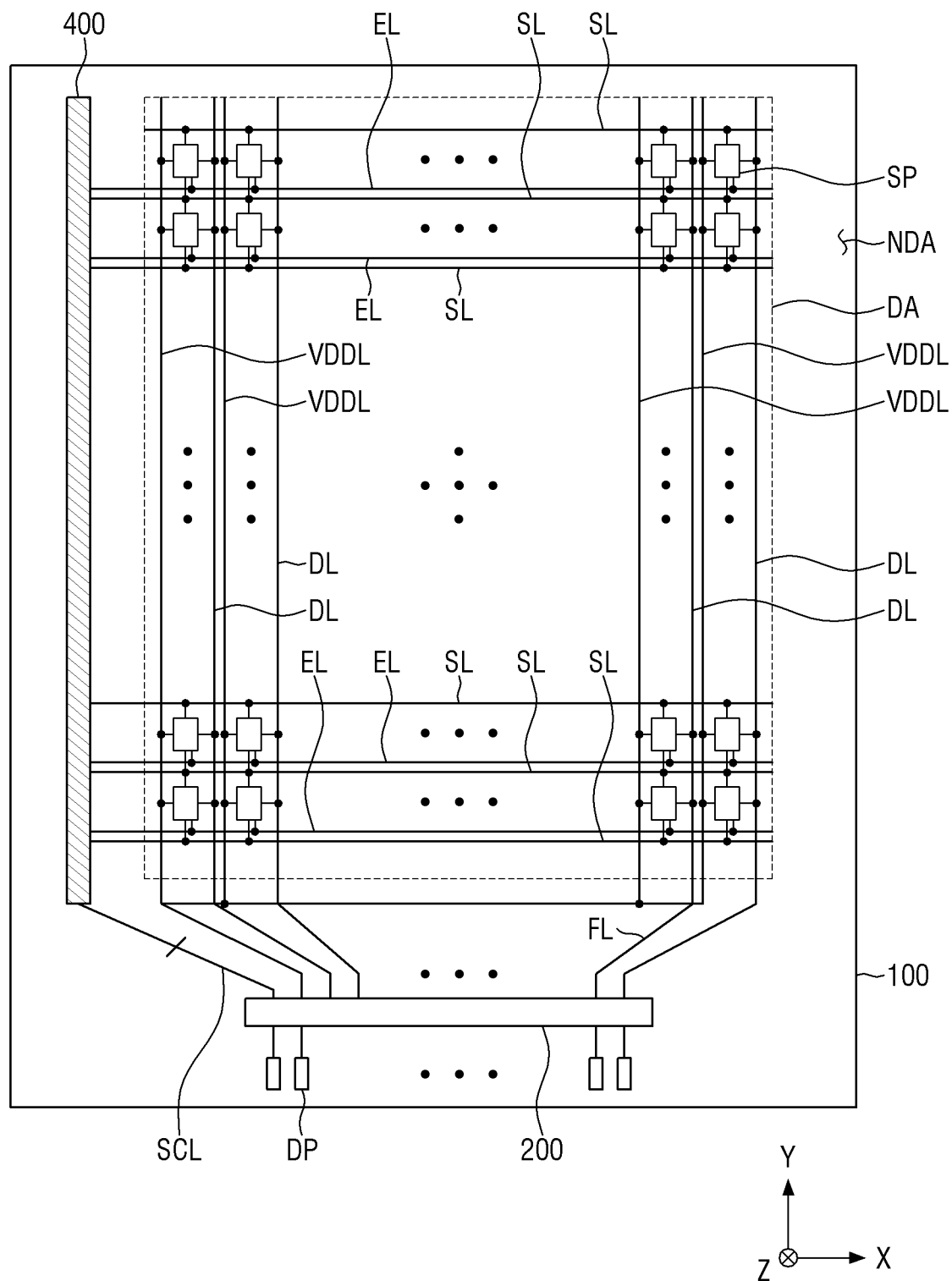
FIG. 2 is a plan view illustrating the display device according to some example embodiments.
Figure 3:
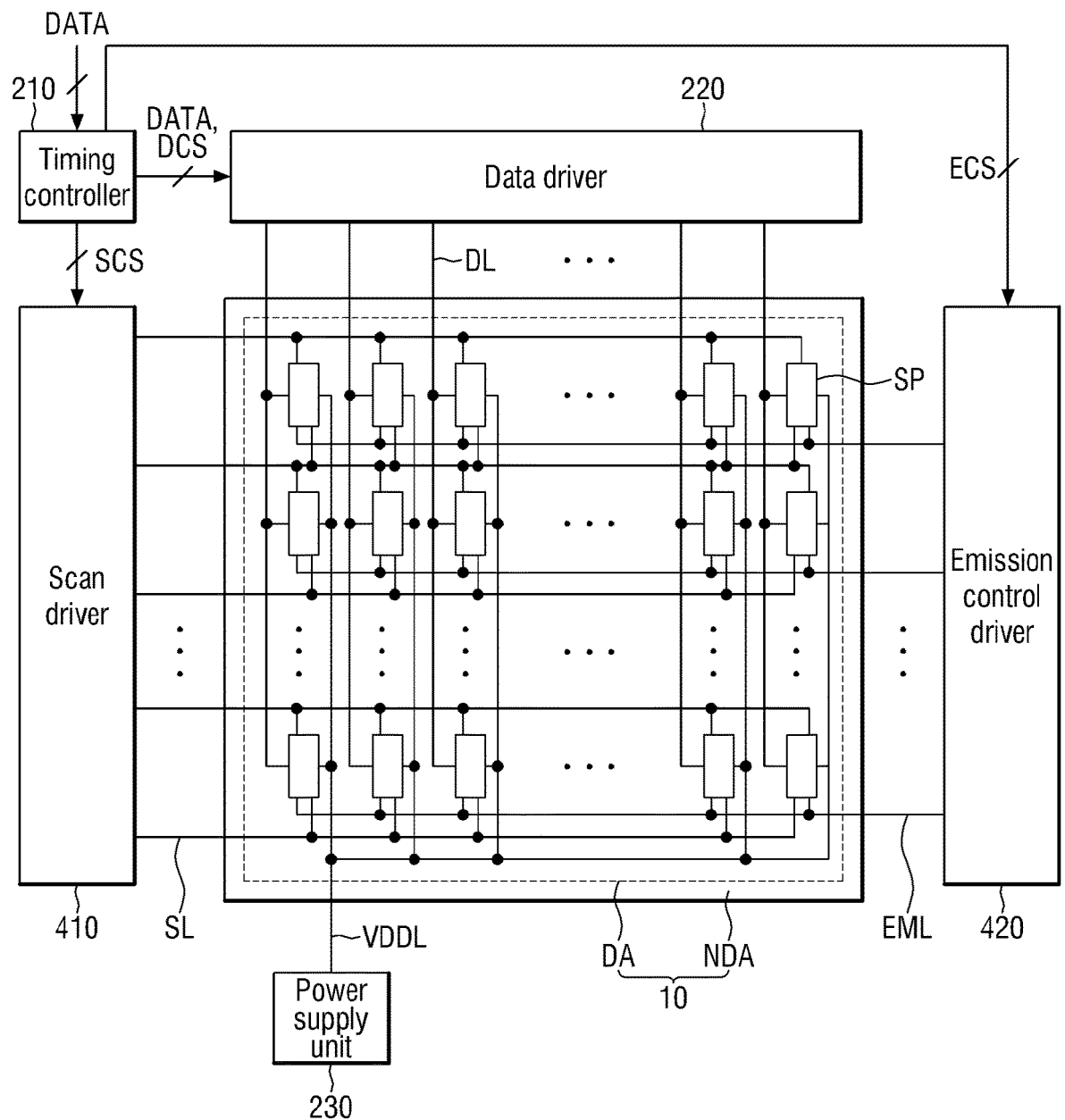
FIG. 3 is a block diagram illustrating the display device according to some example embodiments.

FIG. 1 is a perspective view illustrating a display device according to some example embodiments. FIG. 2 is a plan view illustrating the display device according to some example embodiments. FIG. 3 is a block diagram illustrating the display device according to some example embodiments.

In the present specification, "upper portion," "top," and "upper surface" indicate an upward direction, i.e., a Z-axis direction, from a display panel 100, and "lower portion," "bottom," and "lower surface" indicate a downward direction, i.e., an opposite direction of the Z-axis direction, from the display panel 100. Also, "leftward," "rightward," "upward," and "downward" indicate directions when the display panel 100 is viewed in a plan view. For example, "leftward" indicates an opposite direction of an X-axis direction, "rightward" indicates the X-axis direction, "upward" indicates a Y-axis direction, and "downward" indicates an opposite direction of the Y-axis direction.

Referring to FIGS. 1 to 3, a display device 10 is a device for displaying a video (e.g., moving images, or a plurality of images displayed in succession at a set or predetermined rate) or still (e.g., static) images. The display device 10 may be used as a display screen of not only portable electronic devices, such as mobile phones, smartphones, tablet personal computers (PCs), smart watches, watch phones, mobile communication terminals, electronic notepads, electronic books, portable multimedia players (PMPs), navigation systems, and ultra-mobile PCs (UMPCs), but also various other products such as televisions, laptops, monitors, billboards, Internet-of-Things (IoT) devices, or any other suitable electronic device that may utilize a display device to graphically display images or information to users.

The display device 10 may be, for example, a light emitting display device such as an organic light emitting display device that uses an organic light emitting diode (OLED), a quantum dot light emitting display device that includes a quantum dot emissive layer, an inorganic light emitting display device that includes an inorganic semiconductor, and a micro light emitting display device that uses a micro LED. Hereinafter, description will be given in the context of the display device 10 being an organic light emitting display device, but embodiments according to the present invention are not limited thereto.

The display device 10 includes the display panel 100, a display driving circuit 200, and a circuit board 300.

The display panel 100 may be formed of a rectangular plane having a short side in a first direction (X-axis direction) and a long side in a second direction (Y-axis direction) crossing the first direction (X-axis direction). A corner at which the short side in the first direction (X-axis direction) and the long side in the second direction (Y-axis direction) meet may be formed to be round to have a curvature (e.g., a set or predetermined curvature) (e.g., a rounded corner) or formed to be right-angled. The planar form of the display panel 100 is not limited to quadrangular and may also be other polygonal shapes, circular, or elliptical. The display panel 100 may be formed to be flat, but embodiments are not limited thereto. The display panel 100 may include curved portions which are formed at left and right ends and have a constant curvature or a varying curvature. In addition, the display panel 100 may be formed to be flexible so that it is bendable, foldable, or rollable.

The display panel 100 may include a display area DA in which subpixels SP are formed and thus images may be displayed and a non-display area NDA which is a surrounding area of the display area DA. In addition to the subpixels SP, scan lines SL, light emission lines EL, data lines DL, and first driving voltage lines VDDL, which are connected to the subpixels SP, may be located in the display area DA. The scan lines SL and the light emission lines EML may be formed in parallel in the first direction (X-axis direction), and the data lines DL may be formed in parallel in the second direction (Y-axis direction) crossing the first direction (X-axis direction). The first driving voltage lines VDDL may be formed in parallel in the second direction (Y-axis direction) in the display area DA. The first driving voltage lines VDDL which are formed in parallel in the second direction (Y-axis direction) in the display area DA may be connected to each other in the non-display area NDA.

Each subpixel SP may be connected to at least one of the scan lines SL, any one of the data lines DL, at least one of the light emission lines EL, or the first driving voltage line VDDL. Although the case in which each subpixel SP is connected to two scan lines SL, a single data line DL, a single light emission line EL, and the first driving voltage line VDDL has been illustrated as an example in FIG. 2, embodiments according to the present disclosure are not limited thereto. For example, each subpixel SP may also be connected to three scan lines SL instead of two scan lines SL.

Each subpixel SP may include a driving transistor, at least one additional transistor, a light emitting element, and a capacitor. The transistor (e.g., the additional transistor other than the driving transistor) may be turned on when a scan signal is applied thereto from the scan line SL, and thus, a data voltage of the data line DL may be applied to a gate electrode of the driving transistor DT. The driving transistor DT may supply driving current to the light emitting element according to the data voltage applied to the gate electrode. In this way, the light emitting element may emit light. The driving transistor DT and at least one transistor ST may be thin film transistors. The light emitting element may emit light according to the driving current of the driving transistor DT. The light emitting element may be an OLED including a first electrode, an organic emissive layer, and a second electrode. The capacitor may serve to maintain the data voltage applied to the gate electrode of the driving transistor DT constant.

The non-display area NDA may be defined as an area starting from the outside of the display area DA (e.g., an external edge of the display area DA from a plan view) to an edge of the display panel 100. A scan driving circuit SDC for applying scan signals to the scan lines SL, fan outlines FL located between the data lines DL and the display driving circuit 200, and pads DP connected to the display driving circuit 200 may be located in the non-display area NDA. The display driving circuit 200 and the pads DP may be located at one-side edge of the display panel 100. The pads DP may be arranged to be more adjacent to (e.g., closer to) the one-side edge of the display panel 100 than the display driving circuit 200.

The scan driving circuit SDC may be connected to the display driving circuit 200 via a plurality of scan control lines SCL. The scan driving circuit SDC may receive a scan control signal SCS and a light emission control signal ECS from the display driving circuit 200 via the plurality of scan control lines SCL.

The scan driving circuit SDC may include a scan driver 410 and an emission control driver 420 as illustrated in FIG. 3.

The scan driver 410 may generate scan signals according to the scan control signal SCS and sequentially output the scan signals to the scan lines SL. The emission control driver 420 may generate light emission control signals according to the light emission control signal ECS and sequentially output the light emission control signals to the light emission lines EL.

The scan driving circuit SDC may include a plurality of thin film transistors. The scan driving circuit SDC may be formed at the same layer as the thin film transistors of the subpixels SP. Although the case in which the scan driving circuit SDC is formed at one side of the display area DA (e.g., the non-display area NDA at the left side) has been illustrated as an example in FIG. 2, embodiments according to the present disclosure are not limited thereto. For example, the scan driving circuit SDC may be formed at both sides of the display area DA (e.g., the non-display areas NDA at the left and right sides).

As illustrated in FIG. 3, the display driving circuit 200 may include a timing controller 210, a data driver 220, and a power supply unit (or power supply circuit or power supply) 230.

The timing controller 210 receives digital video data DATA and timing signals from the circuit board 300. The timing controller 210 may generate the scan control signal SCS for controlling an operation timing of the scan driver 410 according to the timing signals, generate the light emission control signal ECS for controlling an operation timing of the emission control driver 420, and generate a data control signal DCS for controlling an operation timing of the data driver 220. The timing controller 210 may output the scan control signal SCS to the scan driver 410 via the plurality of scan control lines SCL and output the light emission control signal ECS to the emission control driver 420. The timing controller 210 may output the digital video data DATA and the data control signal DCS to the data driver 220.

The data driver 220 converts the digital video data DATA into analog positive/negative data voltages and outputs the analog data voltages to the data lines DL via the fan outlines FL. The subpixels SP are selected by the scan signals of the scan driving circuit SDC, and the data voltages are supplied to the selected subpixels SP.

The power supply unit 230 may generate a first driving voltage and supply the generated first driving voltage to the first driving voltage line VDDL. Also, the power supply unit 230 may generate a second driving voltage and supply the generated second driving voltage to a cathode electrode of the OLED of each subpixel SP. The first driving voltage may be a high-potential voltage for driving the OLED, and the second driving voltage may be a low-potential voltage for driving the OLED. That is, the first driving voltage may have a potential that is higher than the second driving voltage.

The display driving circuit 200 may be formed as an integrated circuit (IC) and attached onto the display panel 100 using any suitable technique or mechanism for mounting an integrated circuit, for example, a chip-on-glass (COG) method, a chip-on-plastic (COP) method, or an ultrasonic bonding method, but embodiments are not limited thereto. For example, the display driving circuit 200 may be attached onto the circuit board 300.

The circuit board 300 may be attached onto the pads DP using an anisotropic conductive film. Thus, lead lines of the circuit board 300 may be electrically connected to the pads DP. According to some example embodiments, the circuit board 300 may be a flexible film such as a flexible printed circuit board, a printed circuit board, or a chip-on-film.

Figure 4:
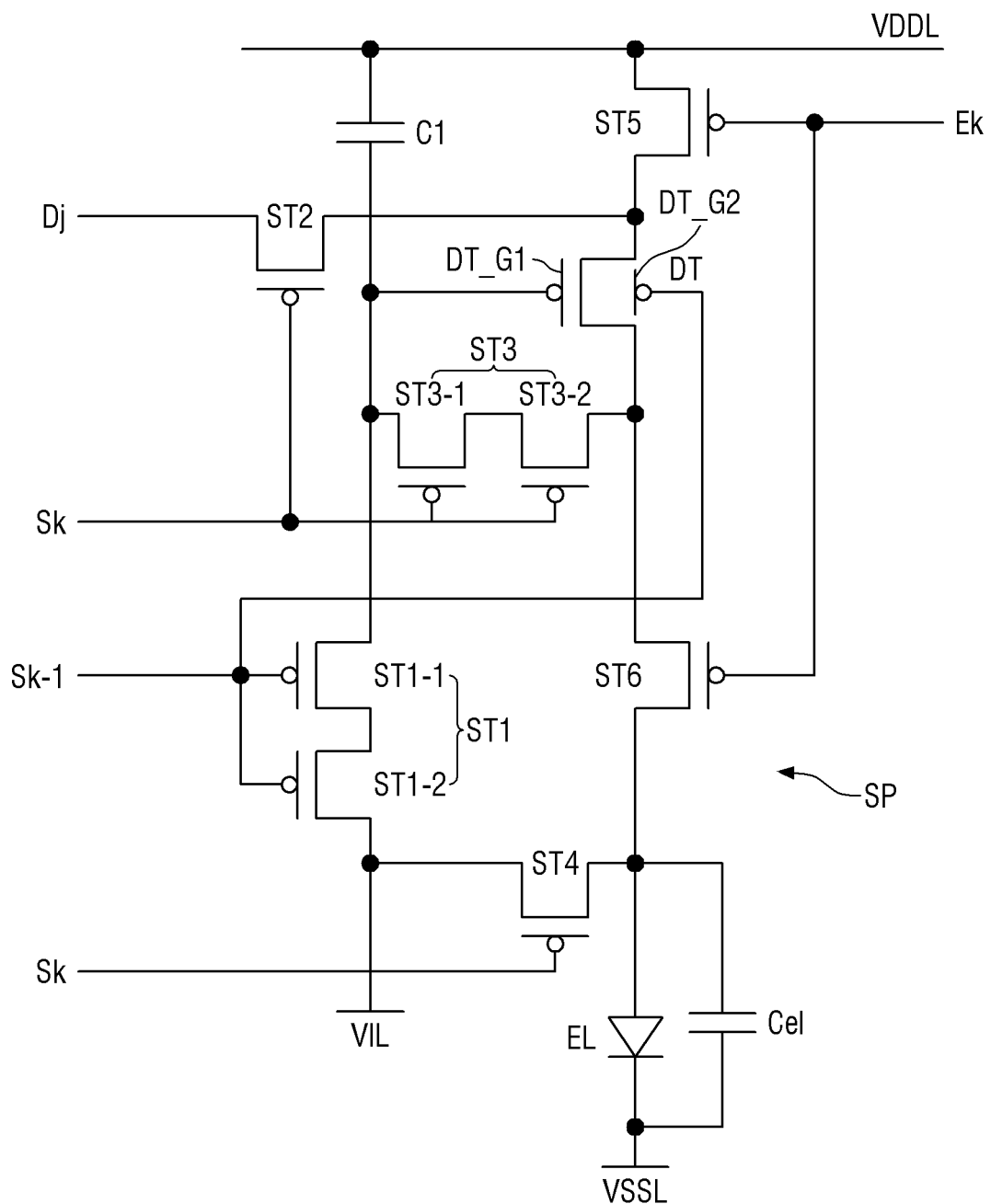
FIG. 4 is a circuit diagram illustrating a subpixel according to some example embodiments.

FIG. 4 is a circuit diagram illustrating a subpixel according to some example embodiments in more detail.

Referring to FIG. 4, a subpixel SP may be connected to a (k−1)-th (where k is a positive integer which is 2 or greater) scan line Sk−1, a k-th scan line Sk, a (k+1)-th scan line (Sk+1), and a j-th (where j is a positive integer) data line Dj. Also, the subpixel SP may be connected to the first driving voltage line VDDL to which the first driving voltage is supplied, an initialization voltage line VIL to which an initialization voltage Vini is supplied, and a second driving voltage line VSSL to which the second driving voltage is supplied.

The subpixel SP includes the driving transistor DT, a light emitting element LE, switching elements, and a capacitor C1. The switching elements include first to sixth transistors ST1, ST2, ST3, ST4, ST5, and ST6.

The driving transistor DT may include a first gate electrode DT_G1, a second gate electrode DT_G2, a first electrode, and a second electrode. The first gate electrode DT_G1 may be a top gate electrode located at an upper portion of an active layer of the driving transistor DT, and the second gate electrode DT_G2 may be a bottom gate electrode located t a lower portion of the active layer of the driving transistor DT.

The second gate electrode DT_G2 of the driving transistor DT may be connected to the (k−1)-th scan line Sk−1. The driving transistor DT controls drain-source current Ids (hereinafter referred to as "driving current) based on a data voltage applied to the first gate electrode DT_G1. As shown in Equation 1, the driving current Ids flowing through a channel of the driving transistor DT may be proportional to a square of a difference between a threshold voltage and a voltage difference Vgs between the first gate electrode DT_G1 and a source electrode of the driving transistor DT.

$$Ids = k' \times (Vgs - Vth)^2 \qquad \text{[Equation 1]}$$

In Equation 1, k' represents a proportional coefficient determined by a structure and physical characteristics of the driving transistor, Vgs represents a gate-source voltage of the driving transistor, and Vth represents the threshold voltage of the driving transistor.

The light emitting element EL emits light according to the driving current Ids. The light emission amount of the light emitting element EL may be proportional to the driving current Ids.

The light emitting element EL may be an OLED including an anode electrode, a cathode electrode, and an organic emissive layer located between the anode electrode and the cathode electrode. Alternatively, the light emitting element EL may be an inorganic light emitting element including an anode electrode, a cathode electrode, and an inorganic semiconductor located between the anode electrode and the cathode electrode. Alternatively, the light emitting element EL may be a quantum dot light emitting element including an anode electrode, a cathode electrode, and a quantum dot emissive layer located between the anode electrode and the cathode electrode. Alternatively, the light emitting element EL may be a micro light emitting diode.

The anode electrode of the light emitting element EL may be connected to a first electrode of the fourth transistor ST4 and a second electrode of the sixth transistor ST6, and the cathode electrode of the light emitting element EL may be connected to the second driving voltage line VSSL. A parasitic capacitance Cel may be formed between the anode electrode and the cathode electrode of the light emitting element EL.

The first transistor ST1 may be formed as a dual transistor including a (1-1)-th transistor ST1-1 and a (1-2)-th transistor ST1-2. The (1-1)-th transistor ST1-1 and the (1-2)-th transistor ST1-2 are turned on by a scan signal of the (k−1)-th scan line Sk−1 and connect the gate electrode of the driving transistor DT and the initialization voltage line VIL to each other. The gate electrode of the driving transistor DT may be discharged to the initialization voltage of the initialization voltage line VIL. The gate electrode of the (1-1)-th transistor ST1-1 may be connected to the (k−1)-th scan line Sk−1, the first electrode of the (1-1)-th transistor ST1-1 may be connected to the gate electrode of the driving transistor DT, and the second electrode of the (1-1)-th transistor ST1-1 may be connected to the first electrode of the (1-2)-th transistor ST1-2. The gate electrode of the (1-2)-th transistor ST1-2 may be connected to the (k−1)-th scan line Sk−1, the first electrode of the (1-2)-th transistor ST1-2 may be connected to the second electrode of the (1-1)-th transistor ST1-1, and the second electrode of the (1-2)-th transistor ST1-2 may be connected to the initialization voltage line VIL.

The second transistor ST2 is turned on by a scan signal of the k-th scan line Sk and connects the first electrode of the driving transistor DT and the j-th data line Dj to each other. The gate electrode of the second transistor ST2 may be connected to the k-th scan line Sk, the first electrode of the second transistor ST2 may be connected to the first electrode of the driving transistor DT, and the second electrode of the second transistor ST2 may be connected to the j-th data line Dj.

The third transistor ST3 may be formed as a dual transistor including a (3-1)-th transistor ST3-1 and a (3-2)-th transistor ST3-2. Thus, according to some example embodiments, the third transistor ST3 may include, for example, two transistors coupled in series, with gate electrodes electrically coupled to each other. The (3-1)-th transistor ST3-1 and the (3-2)-th transistor ST3-2 are turned on by a scan signal of the k-th scan line Sk and connect the gate electrode and the second electrode of the driving transistor DT to each other. That is, when the (3-1)-th transistor ST3-1 and the (3-2)-th transistor ST3-2 are turned on, because the gate electrode and the second electrode of the driving transistor DT are connected to each other, the driving transistor DT is driven as a diode. The gate electrode of the (3-1)-th transistor ST3-1 may be connected to the k-th scan line Sk, the first electrode of the (3-1)-th transistor ST3-1 may be connected to the second electrode of the (3-2)-th transistor ST3-2, and the second electrode of the (3-1)-th transistor ST3-1 may be connected to the gate electrode of the driving transistor DT. The gate electrode of the (3-2)-th transistor ST3-2 may be connected to the k-th scan line Sk, the first electrode of the (3-2)-th transistor ST3-2 may be connected to the second electrode of the driving transistor DT, and the second electrode of the (3-2)-th transistor ST3-2 may be connected to the first electrode of the (3-1)-th transistor ST3-1 thereof.

The fourth transistor ST4 is turned on by a scan signal of the k-th scan line Sk and connects the anode electrode of the light emitting element EL and the initialization voltage line VIL to each other. The anode electrode of the light emitting element EL may be discharged to the initialization voltage. The gate electrode of the fourth transistor ST4 is connected to the k-th scan line Sk, the first electrode of the fourth transistor ST4 is connected to the anode electrode of the light emitting element EL, and the second electrode of the fourth transistor ST4 is connected to the initialization voltage line VIL.

The fifth transistor ST5 is turned on by a light emission control signal of a k-th light emission line Ek and connects the first electrode of the driving transistor DT and the first driving voltage line VDDL to each other. The gate electrode of the fifth transistor ST5 is connected to the k-th light emission line Ek, the first electrode of the fifth transistor ST5 is connected to the first driving voltage line VDDL, and the second electrode of the fifth transistor ST5 is connected to the source electrode of the driving transistor DT.

The sixth transistor ST6 is connected between the second electrode of the driving transistor DT and the anode electrode of the light emitting element EL. The sixth transistor ST6 is turned on by a light emission control signal of the k-th light emission line Ek and connects the second electrode of the driving transistor DT and the anode electrode of the light emitting element EL to each other. The gate electrode of the sixth transistor ST6 is connected to the k-th light emission line Ek, the first electrode of the sixth transistor ST6 is connected to the second electrode of the driving transistor DT, and the second electrode of the sixth transistor ST6 is connected to the anode electrode of the light emitting element EL. When both the fifth transistor ST5 and the sixth transistor ST6 are turned on, the driving current Ids may be supplied to the light emitting element EL.

The capacitor C1 is formed or connected between the second electrode of the driving transistor DT and the first driving voltage line VDDL. One electrode of the capacitor C1 may be connected to the second electrode of the driving transistor DT, and another electrode of the capacitor C1 may be connected to the first driving voltage line VDDL.

When the first electrode of each of the first to sixth transistors ST1, ST2, ST3, ST4, ST5, and ST6 and the driving transistor DT is a source electrode, the second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode.

An active layer of each of the first to sixth transistors ST1, ST2, ST3, ST4, ST5, and ST6 and the driving transistor DT may be formed of any one of polysilicon, amorphous silicon, and oxide semiconductor. When a semiconductor layer of each of the first to sixth transistors ST1, ST2, ST3, ST4, ST5, and ST6 and the driving transistor DT is formed of polysilicon, a process for forming the semiconductor layer may be a low-temperature polysilicon (LTPS) process.

Also, although FIG. 4 has been described above assuming that each of the first to sixth transistors ST1, ST2, ST3, ST4, ST5, and ST6 and the driving transistor DT is formed as a P-type metal oxide semiconductor field effect transistor (MOSFET), embodiments are not limited thereto, and each of the first to sixth transistors ST1, ST2, ST3, ST4, ST5, and ST6 and the driving transistor DT may also be formed as an N-type MOSFET. When each of the first to sixth transistors ST1, ST2, ST3, ST4, ST5, and ST6 and the driving transistor DT is formed as an N-type MOSFET, timings shown in FIG. 5 should be modified corresponding to characteristics of the N-type MOSFET.

Additionally, according to some example embodiments, the number of transistors and capacitors may vary without departing from the spirit and scope of embodiments according to the present disclosure. For example, according to some example embodiments, there may be additional components.

The first driving voltage of the first driving voltage line VDDL, the second driving voltage of the second driving voltage line VSSL, and the initialization voltage of the initialization voltage line $Vini$ may be set in consideration of characteristics of the driving transistor DT, characteristics of the light emitting element EL, and the like. For example, a voltage difference between the initialization voltage and the data voltage supplied to the source electrode of the driving transistor DT may be set to be lower than the threshold voltage of the driving transistor DT.

Figure 5:
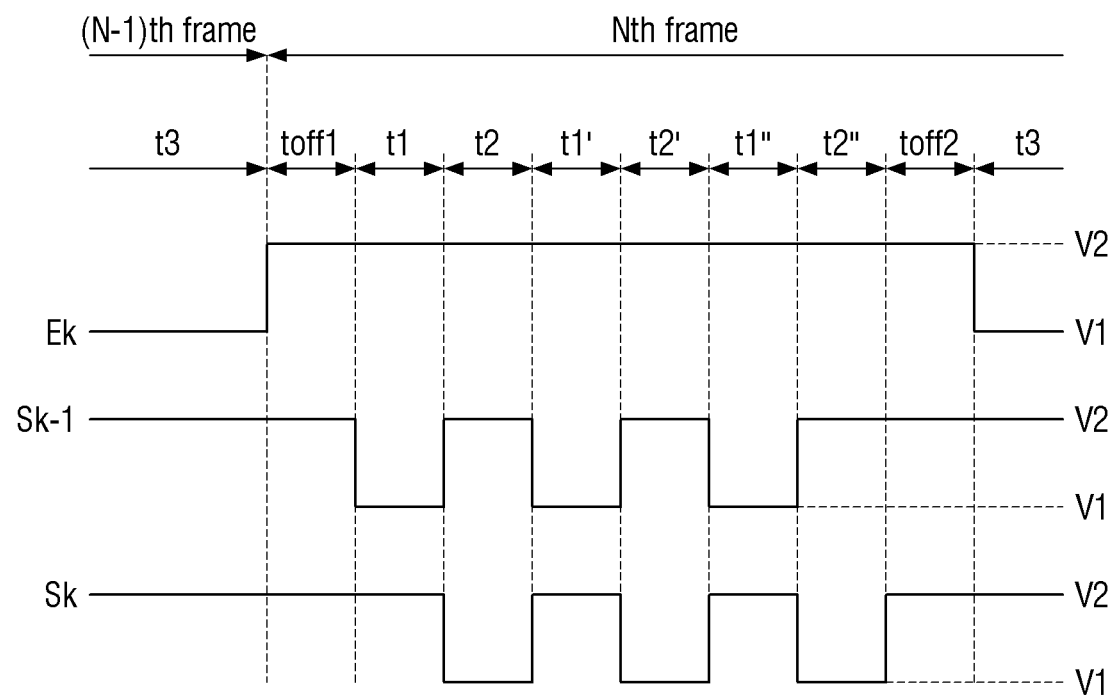
FIG. 5 is a waveform diagram showing signals applied to a (k−1)-th scan line, a k-th scan line, a (k+1)-th scan line, and a k-th light emission line of FIG. 4.

FIG. 5 is a waveform diagram showing signals applied to a (k−1)-th scan line, a k-th scan line, and a k-th light emission line of FIG. 4.

Referring to FIG. 5, a (k−1)-th scan signal SCANk−1 applied to the (k−1)-th scan line Sk−1 is a signal for controlling turning-on and turning-off of the first transistor ST1. A k-th scan signal SCANk applied to the k-th scan line Sk is a signal for controlling turning-on and turning-off of each of the second transistor ST2, the third transistor ST3, and the fourth transistor ST4. A k-th light emission signal EMk is a signal for controlling the fifth transistor ST5 and the sixth transistor ST6.

The (k−1)-th scan signal SCANk−1, the k-th scan signal SCANk, and the k-th light emission signal EMk may be generated every one frame period. The one frame period may be divided into a plurality of first periods t1, t1', and t1", a plurality of second periods t2, t2', and t2", a third period t3, a first off-period off1, and a second off-period off2. Each of the plurality of first periods t1, t1', and t1" is a period in which the initialization voltage Vini is applied to the first gate electrode DT_G1 of the driving transistor DT and thus the driving transistor DT is biased on, each of the plurality of second periods t2, t2', and t2" is a period in which a data voltage is supplied to the first gate electrode DT_G1 of the driving transistor DT and the threshold voltage of the driving transistor DT is sampled, and the third period t3 is a period in which the light emitting element EL emits light according to the voltage of the first gate electrode DT_G1 of the driving transistor DT. The first off-period off1 may be located before the earliest first period t1 in the one frame period, and the second off-period off2 may be located between the third period t3 and the second period t2 which is the latest in the one frame period. Each of the first off-period off1 and the second off-period off2 is a period in which all of the driving transistor DT and the first to sixth transistors ST1, ST2, ST3, ST4, ST5, and ST6 are turned off.

The plurality of first periods t1, t1', and t1" and the plurality of second periods t2, t2', and t2" may be alternately repeated. For example, the plurality of first periods t1, t1', and t1" and the plurality of second periods t2, t2', and t2" may be located in the order of the first period t1, the second period t2, the first period t1', the second period t2', the first period t1", and the second period t2". Meanwhile, although the case in which the one frame period includes three first periods t1, t1', and t1" and three second periods t2, t2', and t2" is illustrated as an example in FIG. 5, embodiments are not limited thereto. For example, the one frame period may include a single first period t1 and a single second period t2, include two first periods t1 and t1' and two second periods t2 and t2', or include four or more first periods and four or more second periods. In the one frame period, the number of first periods and the number of second periods may be the same.

The (k−1)-th scan signal SCANk−1 may be output at a first level voltage V1 during the plurality of first periods t1, t1', and t1" and output at a second level voltage V2 during the plurality of second periods t2, t2', and t2". For example, the (k−1)-th scan signal SCANk−1 may have the first level voltage V1 during the plurality of first periods t1, t1', and t1" and have the second level voltage V2 during the remaining periods. The k-th scan signal SCANk may have the first level voltage V1 during the plurality of second periods t2, t2', and t2" and have the second level voltage V2 during the remaining periods. The k-th light emission signal EMk may have the first level voltage V1 during the third period t3 and have the second level voltage V2 during the remaining periods.

Each of the plurality of first periods t1, t1', and t1", the plurality of second periods t2, t2', and t2", the first off-period off1, and the second off-period off2 is illustrated as one horizontal period in FIG. 5. The one horizontal period indicates a period in which a data voltage is supplied to each of the subpixels SP connected to any scan line of the display panel 100. Thus, the one horizontal period may be defined as one horizontal line scan period. The data voltages may be supplied to the data lines DL in synchronization with the first level voltage V1 of each of the scan signals.

The first level voltage V1 corresponds to a scan-on voltage capable of turning on each of the first to sixth transistors ST1, ST2, ST3, ST4, ST5, and ST6. The second level voltage V2 corresponds to a scan-off voltage capable of turning off each of the first to sixth transistors ST1, ST2, ST3, ST4, ST5, and ST6. The first level voltage V1 may be about −8 V, and the second level voltage V2 may be 7 V. The initialization voltage Vini may be higher than the first level voltage V1 and lower than the second level voltage V2. The initialization voltage Vini may be about −3.5 V.

Figure 6:
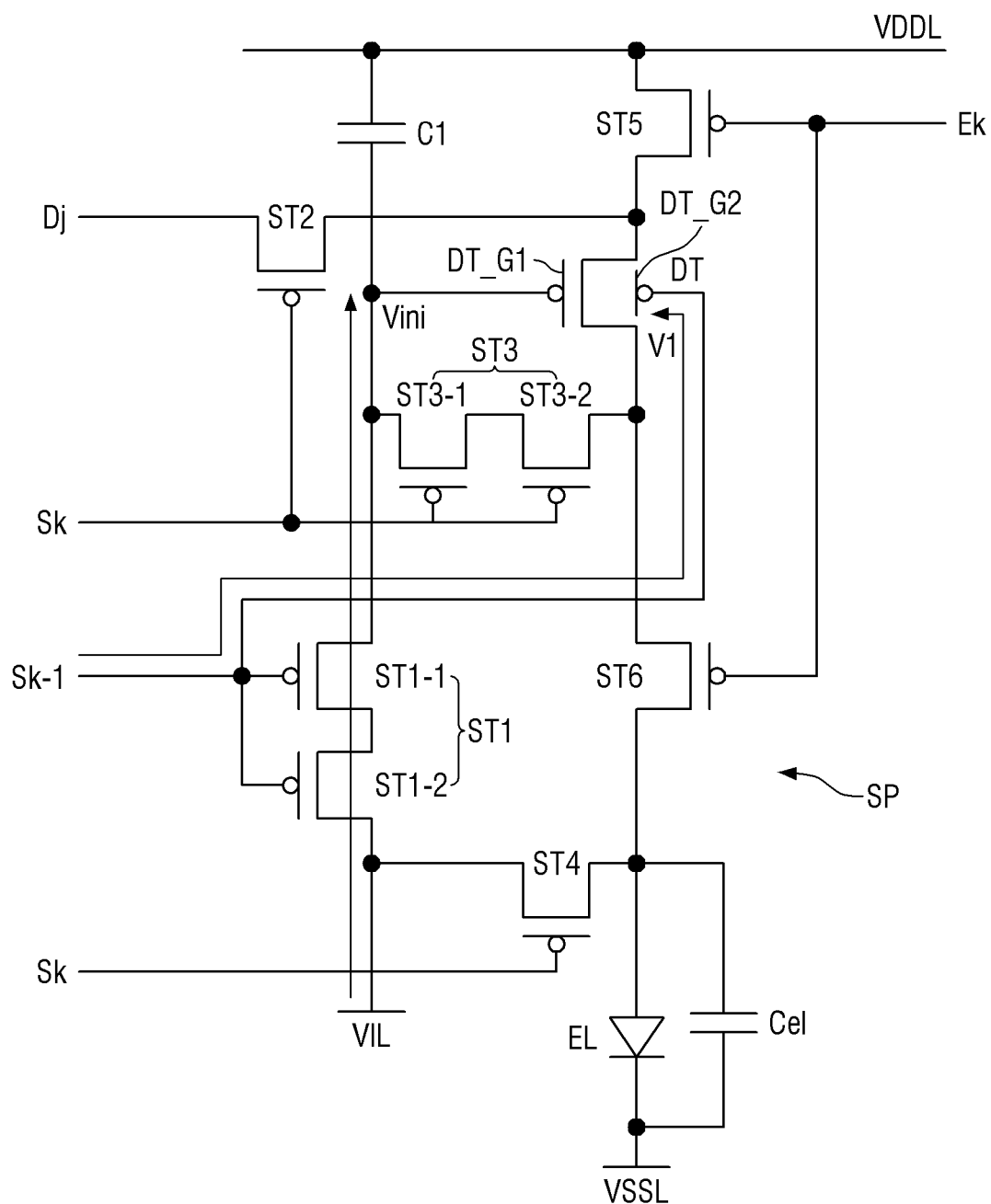
FIGS. 6 to 8 are circuit diagrams for describing a method of driving the subpixel during a plurality of first periods, a plurality of second periods, and a third period of FIG. 5.
Figure 7:
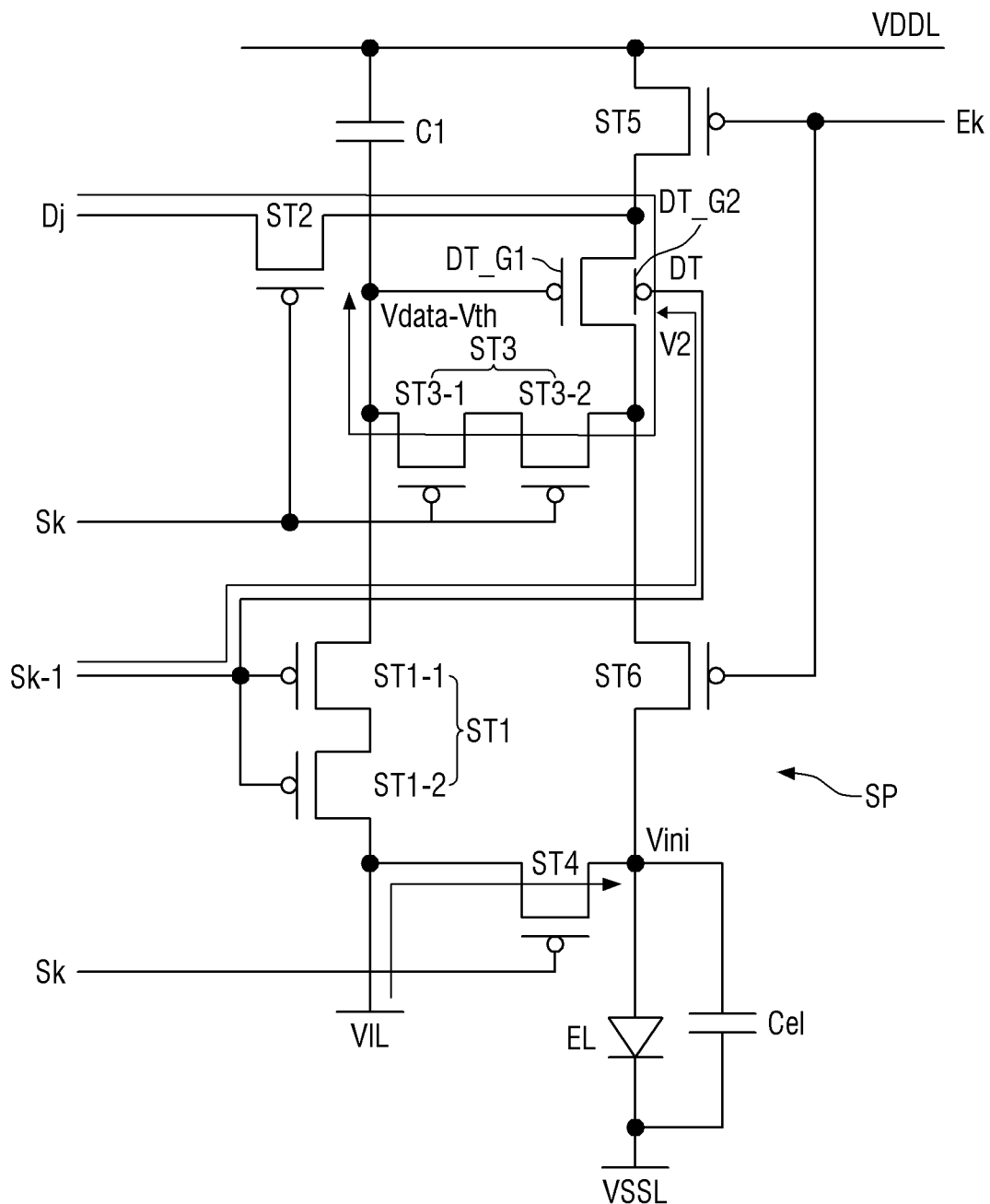
Figure 8:
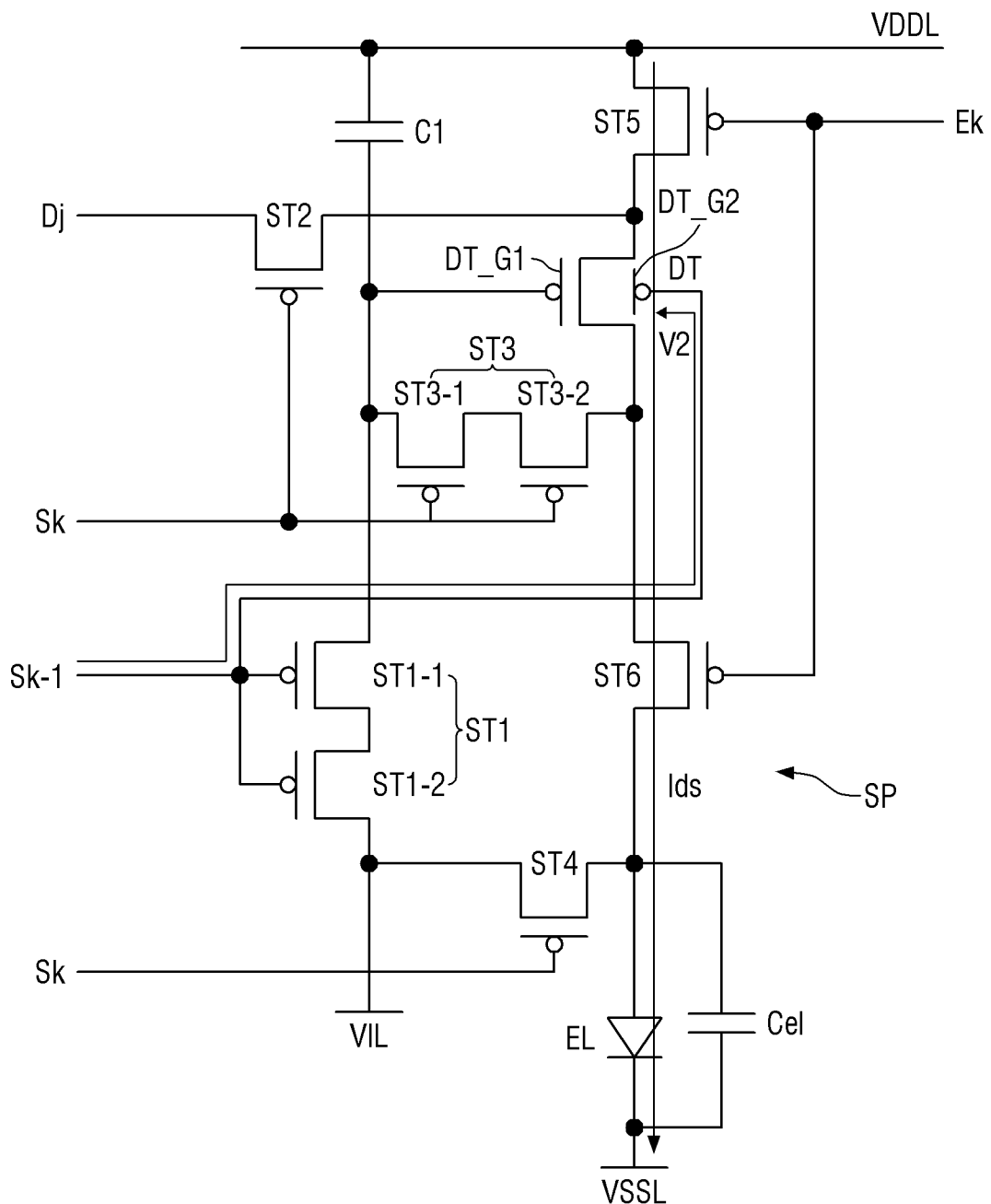

FIGS. 6 to 8 are circuit diagrams for describing a method of driving the subpixel during first to fourth periods of FIG. 5.

Hereinafter, operation of the subpixel SP during the first off-period off1, the plurality of first periods t1, t1', and t1", the plurality of second periods t2, t2', and t2", the second off-period off2, and the third period t3 will be described in more detail with reference to FIGS. 6 to 8.

First, during the first off-period off1, all of the driving transistor DT and the first to sixth transistors ST1, ST2, ST3, ST4, ST5, and ST6 of the subpixel SP are turned off.

Second, in each of the plurality of first periods t1, t1', and t1", the (k−1)-th scan signal SCANk−1 having the first level voltage V1 is supplied to the (k−1)-th scan line Sk−1. In each of the plurality of first periods t1, t1', and t1", as illustrated in FIG. 6, the first transistor ST1 is turned on by the (k−1)-th scan signal SCANk−1 having the first level voltage V1. Due to the first transistor ST1 being turned on, the initialization voltage Vini of the initialization voltage line VIL is applied to the first gate electrode DT_G1 of the driving transistor DT.

Figure 9:
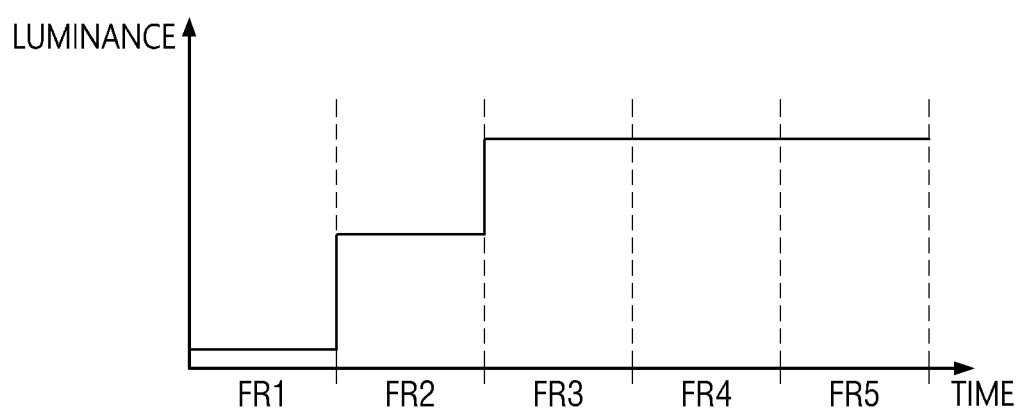
FIG. 9 is a graph showing a stepwise rise of luminance of a light emitting element due to the hysteresis characteristic of a driving transistor.

When it is attempted to display black luminance and then display white luminance, the driving current Ids of the driving transistor DT rises stepwise due to the hysteresis characteristic of the driving transistor DT, and thus luminance of the light emitting element EL also rises stepwise. In FIG. 9, a first frame period FR1 corresponds to a black display period in which the light emitting element EL emits light with black luminance (or does not emit light, or emits a low level of light), and second to fourth frame periods FR2 to FR4 correspond to white display periods in which the light emitting element EL emits light with white luminance. In FIG. 9, the X-axis indicates time, and the Y-axis indicates luminance of the light emitting element EL.

When the light emitting element EL displays black luminance, the curve of the driving current Ids of the driving transistor DT may be positively shifted, and, when the light emitting element EL displays white luminance, the curve of the driving current Ids of the driving transistor DT may be negatively shifted. When the light emitting element EL displays black luminance and then displays white luminance, the curve of the driving current Ids of the driving transistor DT may be negatively shifted gradually. Therefore, even when the same data voltage is applied, the driving current Ids of the driving transistor DT supplied to the light emitting element EL in the second to fourth frame periods FR2 to FR4 increases stepwise. Accordingly, the luminance with which the light emitting element EL emits light also increases stepwise in the second to fourth frame periods FR2 to FR4 as illustrated in FIG. 9.

In order to reduce a luminance difference between frame periods which occurs due to the stepwise rise of the luminance of the light emitting element EL due to the hysteresis characteristic of the driving transistor DT, the driving transistor DT is biased on in each of the plurality of first periods t1, t1', and t1". When the initialization voltage Vini is applied to the first gate electrode DT_G1 of the driving transistor DT in each of the plurality of first periods t1, t1', and t1", because a voltage difference between the first gate electrode DT_G1 and the first electrode of the driving transistor DT is lower than the threshold voltage Vth of the driving transistor DT, the driving transistor DT may be turned on. That is, the driving transistor DT may be biased on.

Also, in each of the plurality of first periods t1, t1', and t1", the first level voltage V1 of the (k–1)-th scan signal SCANk–1 is applied to the second gate electrode DT_G2 of the driving transistor DT. The first level voltage V1 may be lower than the initialization voltage Vini. Thus, during the first period t1, the voltage difference between the second gate electrode DT_G2 and the first electrode of the driving transistor DT may be lower than the voltage difference between the first gate electrode DT_G1 and the first electrode of the driving transistor DT.

When a voltage difference Vbs between the second gate electrode DT_G2 and the first electrode of the driving transistor DT is lower than 0 V, the curve of the driving current Ids according to the voltage difference Vgs between the first gate electrode DT_G1 and the first electrode of the driving transistor DT is positively shifted. Also, when the voltage difference Vbs between the second gate electrode DT_G2 and the first electrode of the driving transistor DT is higher than 0 V, the curve of the driving current Ids according to the voltage difference Vgs between the first gate electrode DT_G1 and the first electrode of the driving transistor DT is negatively shifted.

Figure 10:
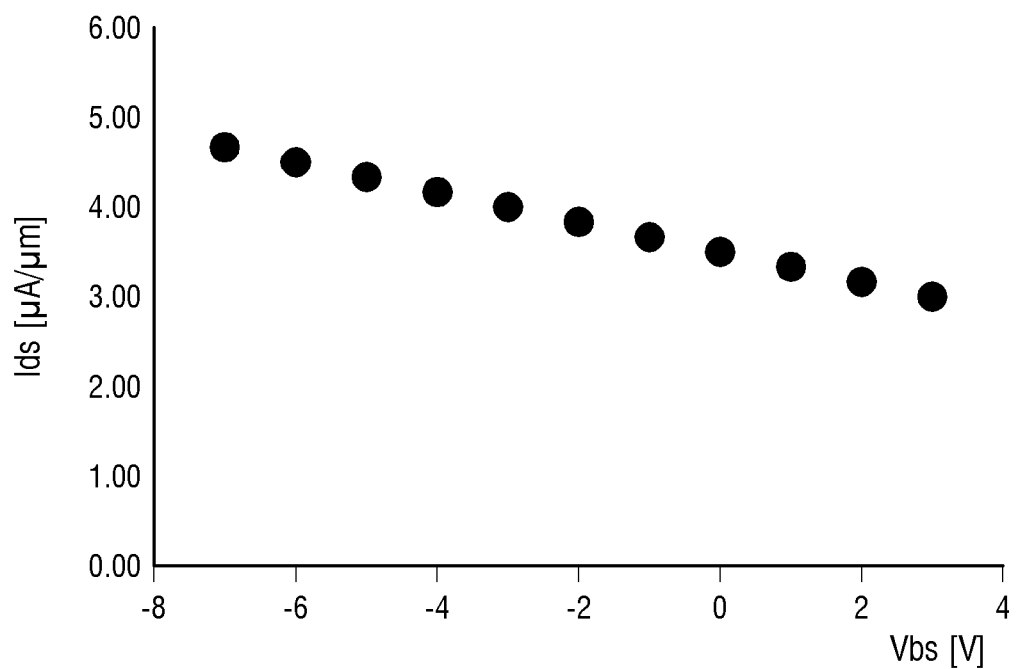
FIG. 10 is a graph showing current between a drain and a source of the driving transistor according to voltages applied to a second gate electrode of the driving transistor.

Thus, as illustrated in FIG. 10, in each of the plurality of first periods t1, t1', and t1", the lower the voltage difference Vbs between the second gate electrode DT_G2 and the first electrode of the driving transistor DT, the more the current Ids of the driving transistor DT increases. In FIG. 10, the X-axis indicates the voltage difference Vbs between the second gate electrode DT_G2 and the first electrode of the driving transistor DT, and the Y-axis indicates the driving current Ids of the driving transistor DT.

Figure 11:
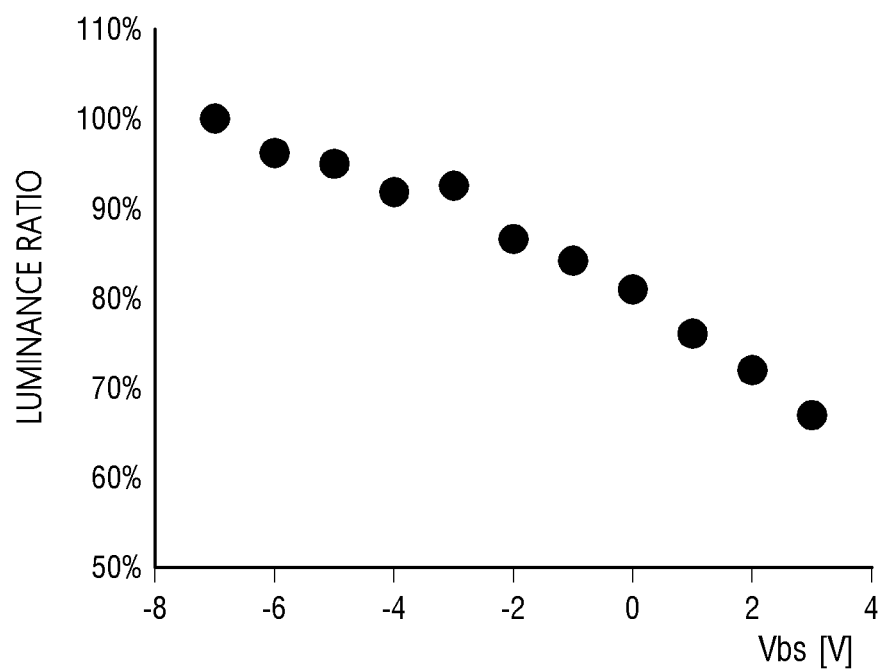
FIG. 11 is a graph showing luminance of the light emitting element in a first frame relative to luminance of the light emitting element in a fourth frame according to voltages between the second gate electrode and a first electrode of the driving transistor.

Therefore, as illustrated in FIG. 11, the smaller the voltage difference Vbs between the second gate electrode DT_G2 and the first electrode of the driving transistor DT in each of the plurality of first periods t1, t1', and t1", the more the luminance difference is minimized or reduced between the second frame period FR2, in which black luminance is displayed and then white luminance is displayed as illustrated in FIG. 9, and the fifth frame period FR5 after three frame periods from the second frame period FR2. In FIG. 11, the X-axis indicates the voltage difference Vbs between the second gate electrode DT_G2 and the first electrode of the driving transistor DT in each of the plurality of first periods t1, t1', and t1", and the Y-axis indicates the luminance of the light emitting element EL in the second frame period FR2 as compared with that of the light emitting element EL in the fifth frame period FR5, i.e., the luminance ratio.

In each of the plurality of first periods t1, t1', and t1", the first level voltage V1 of the (k–1)-th scan signal SCANk–1 applied to the second gate electrode DT_G2 of the driving transistor DT is lower than the initialization voltage Vini. Therefore, in each of the plurality of first periods t1, t1', and t1", a voltage difference between the second gate electrode DT_G2 and the first electrode of the driving transistor DT is lower than a voltage difference between the first gate electrode DT_G1 and the first electrode of the driving transistor DT. Accordingly, when the driving transistor DT includes the second gate electrode DT_G2, as compared with when the second gate electrode DT_G2 is omitted, the driving current Ids of the driving transistor DT may increase in each of the plurality of first periods t1, t1', and t1". Therefore, the stepwise rise of the luminance of the light emitting element EL due to the hysteresis characteristic of the driving transistor DT may be reduced.

Third, in each of the plurality of second periods t2, t2', and t2", the k-th scan signal SCANk having the first level voltage V1 is supplied to the k-th scan line Sk. In each of the plurality of second periods t2, t2', and t2", as illustrated in FIG. 7, each of the second transistor ST2 and the third transistor ST3 is turned on by the k-th scan signal SCANk having the first level voltage V1.

In each of the plurality of second periods t2, t2', and t2", the first gate electrode DT_G1 and the second electrode of the driving transistor DT are connected to each other due to the third transistor ST3 being turned on, and the driving transistor DT is driven as a diode. Due to the second transistor ST2 being turned on, a data voltage Vdata is supplied to the first electrode of the driving transistor DT. In this case, because the voltage (Vgs=Vini–Vdata) between the first gate electrode DT_G1 and the first electrode of the driving transistor DT is lower than the threshold voltage Vth, the driving transistor DT forms a current path until the voltage difference Vgs between the first gate electrode DT_G1 and the source electrode reaches the threshold voltage Vth. Thus, in each of the plurality of second periods t2, t2', and t2", the voltage difference between the first gate electrode DT_G1 and the second electrode of the driving transistor DT rises to a voltage (Vdata+Vth) which is equal to the sum of the data voltage Vdata and the threshold voltage Vth of the driving transistor DT. "Vdata+Vth" may be stored in the capacitor C1.

Also, in each of the plurality of second periods t2, t2', and t2", the second level voltage V2 of the (k–1)-th scan signal SCANk–1 is applied to the second gate electrode DT_G2 of the driving transistor DT. The second level voltage V2 may be higher than the data voltage Vdata. Thus, in each of the plurality of second periods t2, t2', and t2", the voltage difference between the second gate electrode DT_G2 and the first electrode of the driving transistor DT may be higher than the voltage difference between the first gate electrode DT_G1 and the first electrode of the driving transistor DT.

Figure 12:
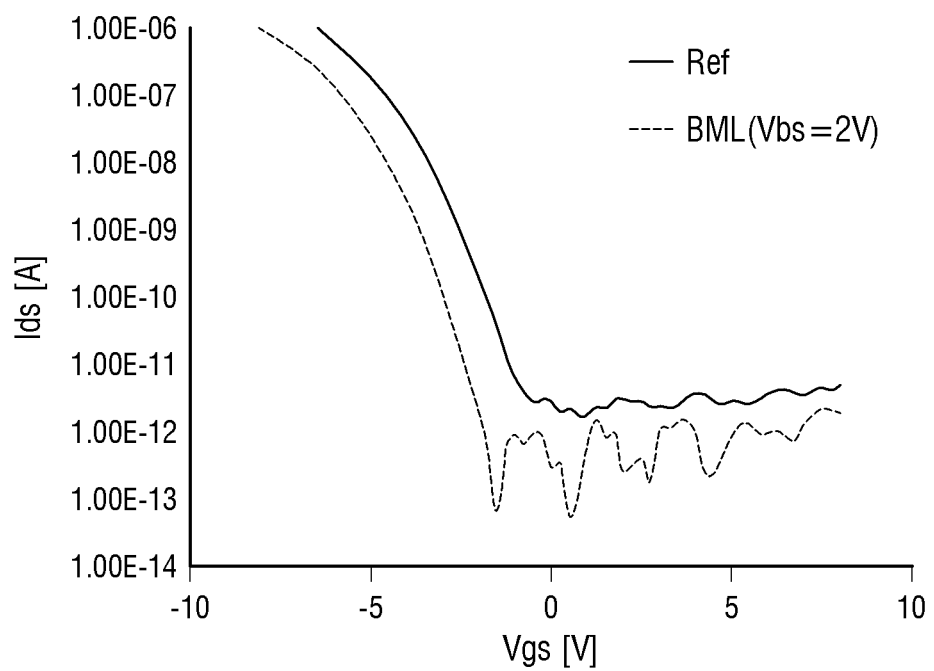
FIG. 12 is a graph showing current between the drain and the source of the driving transistor according to whether the second electrode of the driving transistor is present.

Because the driving transistor DT is formed as a P-type MOSFET, the driving current Ids of the driving transistor DT may be inversely proportional to the voltage difference Vgs between the first gate electrode DT_G1 and the source electrode of the driving transistor DT in a section in which the voltage difference Vgs between the first gate electrode DT_G1 and the source electrode of the driving transistor DT is lower than 0 V as illustrated in FIG. 12. Also, because the driving transistor DT is formed as a P-type MOSFET, the threshold voltage Vth may be lower than 0 V.

Also, in each of the plurality of second periods t2, t2', and t2", the fourth transistor ST4 is turned on by the k-th scan signal SCANk having the first level voltage V1. Due to the fourth transistor ST4 being turned on, the voltage of the anode electrode of the light emitting element EL may be initialized to the initialization voltage Vini of the initialization voltage line VIL.

Meanwhile, because the plurality of first periods t1, t1', and t1" and the plurality of second periods t2, t2', and t2" are alternately repeated as illustrated in FIG. 5, the driving transistor DT may be biased on in each of the plurality of first periods t1, t1', and t1". Therefore, when the one frame period includes the plurality of first periods t1, t1', and t1", as compared with when the one frame period includes a single first period, the stepwise rise of the luminance of light emitting element EL due to the hysteresis characteristic of the driving transistor DT may be further reduced.

Fourth, during the second off-period off2, all of the driving transistor DT and the first to sixth transistors ST1, ST2, ST3, ST4, ST5, and ST6 of the subpixel SP are turned off. During the second off-period off2, the first gate electrode DT_G1 of the driving transistor DT may be maintain the voltage of "Vdata+Vth" due to the capacitor C1.

Fifth, during the third period t3, the k-th light emission signal EMk having the first level voltage V1 is supplied to the k-th light emission line Ek. During the third period t3, as illustrated in FIG. 8, each of the fifth transistor ST5 and the sixth transistor ST6 is turned on by the k-th light emission signal EMk having the first level voltage V1.

Due to the fifth transistor ST5 being turned on, the first electrode of the driving transistor DT is connected to the first driving voltage line VDDL. Due to the sixth transistor ST6 being turned on, the second electrode of the driving transistor DT is connected to the anode electrode of the light emitting element EL.

When both the fifth transistor ST5 and the sixth transistor ST6 are turned on, the driving current Ids flowing according to the voltage of the gate electrode of the driving transistor DT may be supplied to the light emitting element EL. The driving current Ids may be defined as in Equation 2.

$$Ids = k' \times (ELVDD - (Vdata + Vth) - Vth)^2 \qquad \text{[Equation 2]}$$

In Equation 2, k' represents a proportional coefficient determined by a structure and physical characteristics of the driving transistor DT, Vth represents the threshold voltage of the driving transistor DT, ELVDD represents the first driving voltage of the first driving voltage line VDDL, and Vdata represents the data voltage. The gate voltage of the driving transistor DT is equal to (Vdata+Vth), and the voltage of the first electrode is ELVDD. When Equation 2 is simplified, Equation 3 is derived.

$$Ids = k' \times (ELVDD - Vdata)^2 \qquad \text{[Equation 3]}$$

Eventually, as shown in Equation 3, the driving current Ids does not depend on the threshold voltage Vth of the driving transistor DT. That is, the threshold voltage Vth of the driving transistor DT is compensated for.

Also, during the third period t3, the second level voltage V2 of the (k−1)-th scan signal SCANk−1 is applied to the second gate electrode DT_G2 of the driving transistor DT. The second level voltage V2 may be higher than the first driving voltage of the first driving voltage line VDDL. Thus, during the third period t3, the voltage difference between the second gate electrode DT_G2 and the first electrode of the driving transistor DT may be higher than the voltage difference between the first gate electrode DT_G1 and the first electrode of the driving transistor DT.

When the voltage difference Vbs between the second gate electrode DT_G2 and the first electrode of the driving transistor DT is lower than 0 V, the curve of the driving current Ids according to the voltage difference Vgs between the first gate electrode DT_G1 and the first electrode of the driving transistor DT is positively shifted. Also, when the voltage difference Vbs between the second gate electrode DT_G2 and the first electrode of the driving transistor DT is higher than 0 V, the curve of the driving current Ids according to the voltage difference Vgs between the first gate electrode DT_G1 and the first electrode of the driving transistor DT is negatively shifted. When the voltage difference Vbs between the second gate electrode DT_G2 and the first electrode of the driving transistor DT is 2 V as illustrated in FIG. 12, as compared with when the second gate electrode DT_G2 is omitted, the curve of the driving current Ids according to the voltage difference Vgs between the first gate electrode DT_G1 and the first electrode of the driving transistor DT is negatively shifted. In FIG. 12, the X-axis indicates the voltage difference Vgs between the first gate electrode DT_G1 and the first electrode of the driving transistor DT, and the Y-axis indicates the driving current Ids of the driving transistor DT.

Figure 13:
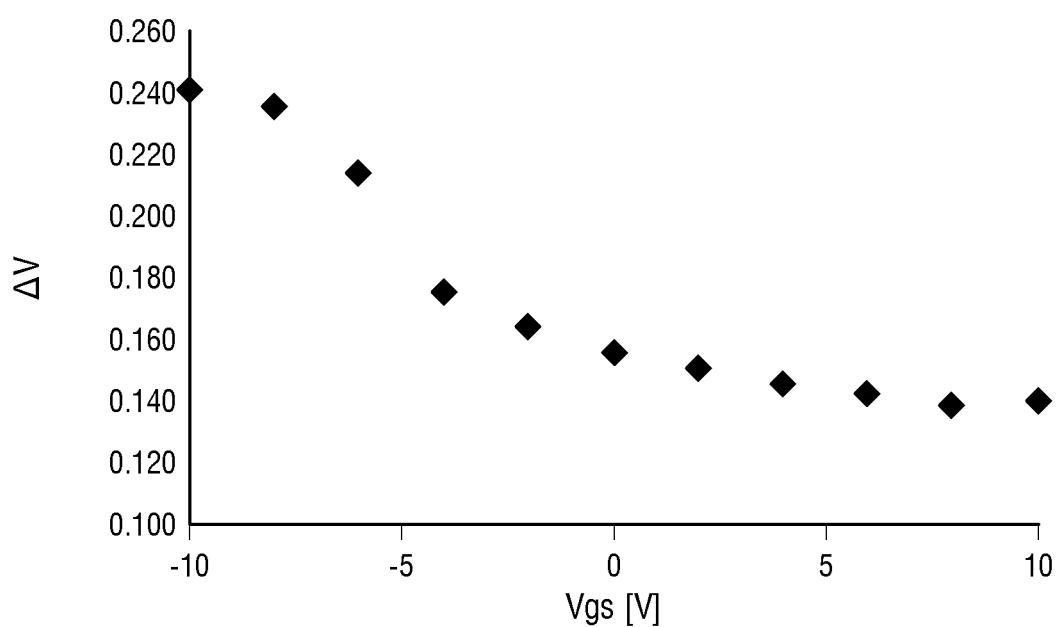
FIG. 13 is a graph showing a change amount of a voltage difference between a first gate electrode and the first electrode when black luminance is displayed and when white luminance is displayed for allowing flow of the same driving current according to a voltage difference between the second gate electrode and the first electrode of the driving transistor.

Also, as illustrated in FIG. 13, during the third period t3, the higher the voltage difference Vbs between the second gate electrode DT_G2 and the first electrode of the driving transistor DT, the smaller the voltage change amount ΔV between Vgs when displaying black luminance and Vgs when displaying white luminance which is for allowing the same driving current to flow. That is, the shift of the curve of the driving current Ids of the driving transistor DT which occurs due to the hysteresis characteristic of the driving transistor DT between when black luminance is displayed and when white luminance is displayed may be reduced. In FIG. 13, the X-axis indicates the voltage difference Vbs between the second gate electrode DT_G2 and the first electrode of the driving transistor DT, and the Y-axis indicates the voltage change amount ΔV between "Vgs" when displaying black luminance and "Vgs" when displaying white luminance which is for allowing the same driving current to flow.

Eventually, due to the hysteresis characteristic of the driving transistor DT, the curve of the driving current Ids of the driving transistor DT may be positively shifted when the light emitting element EL displays black luminance, and the curve of the driving current Ids of the driving transistor DT may be negatively shifted when the light emitting element EL displays white luminance. However, by controlling the voltage difference Vbs between the second gate electrode DT_G2 and the first electrode of the driving transistor DT to be higher than 0 V during the third period t3 in which the light emitting element EL emits light, the curve of the driving current Ids according to the voltage difference Vgs between the first gate electrode DT_G1 and the first electrode of the driving transistor DT may be negatively shifted as illustrated in FIG. 10. Accordingly, even when the light emitting element EL displays black luminance during the third period t3, the positive shift of the curve of the driving current Ids of the driving transistor DT due to the hysteresis characteristic of the driving transistor DT may be minimized.

Figure 14:
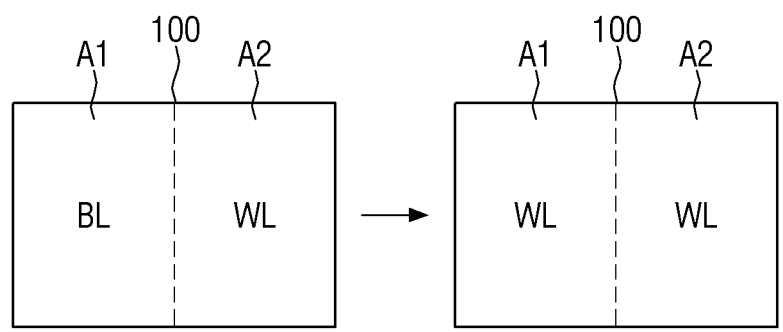
FIG. 14 is a graph showing an instantaneous afterimage according to voltages between the second gate electrode and the first electrode of the driving transistor.
Figure 14:
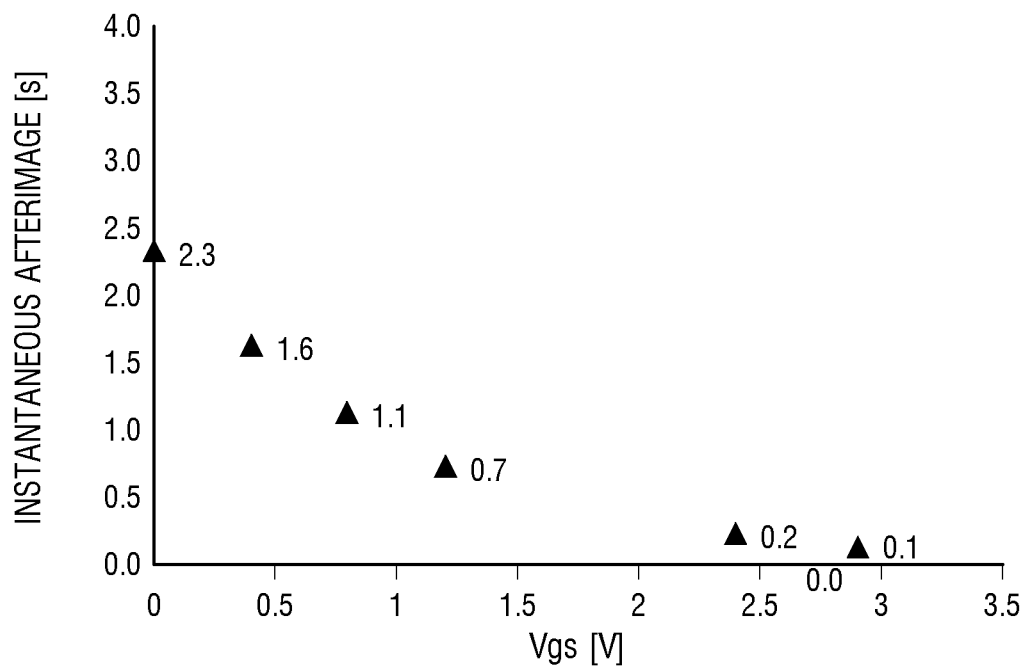

Further, the higher the voltage difference Vbs between the second gate electrode DT_G2 and the first electrode of the driving transistor DT during the third period t3, the more the shift of the curve of the driving current Ids due to the hysteresis characteristic of the driving transistor DT is reduced between when displaying black luminance and when displaying white luminance. Therefore, during the third period t3, the higher the voltage difference Vbs between the second gate electrode DT_G2 and the first electrode of the driving transistor DT, the more a time s during which an instantaneous afterimage is generated is reduced. The time s during which an instantaneous afterimage is generated indicates a time during which an afterimage is generated when, after black luminance BL is displayed in a first region of the display panel 100, and then white luminance WL is displayed in a second region of the display panel 100 for about 10 seconds, the white luminance WL is displayed in both the first region and the second region of the display panel 100 as illustrated in FIG. 14. In FIG. 14, the X-axis indicates the voltage difference Vbs between the second gate electrode DT_G2 and the first electrode of the driving transistor DT during the third period t3, and the Y-axis indicates the time s during which an instantaneous afterimage is generated.

As described above, by connecting the second gate electrode DT_G2 of the driving transistor DT to the (k−1)-th scan line Sk−1, the voltage difference between the second gate electrode DT_G2 and the first electrode of the driving transistor DT may be controlled to be lower than the threshold voltage Vth of the driving transistor DT when the driving transistor DT is biased on in each of the plurality of first periods t1, t1', and t1". Therefore, the driving current Ids of the driving transistor DT may be increased. Accordingly, a luminance difference in a light emitting element which occurs due to the hysteresis characteristic of the driving transistor DT when the light emitting element displays black luminance and then displays white luminance may be reduced.

Also, because the voltage difference between the second gate electrode DT_G2 and the first electrode of the driving transistor DT may be controlled to be higher than 0 V during the third period t3, the curve of the driving current Ids of the driving transistor DT may be negatively shifted. Therefore, the shift of the curve of the driving current Ids of the driving transistor DT which occurs due to the hysteresis characteristic of the driving transistor DT between when displaying black luminance and displaying white luminance may be reduced. Accordingly, not only is it possible to reduce the luminance difference in the light emitting element which occurs due to the hysteresis characteristic of the driving transistor DT when the light emitting element displays black luminance and then displays white luminance, but also it is possible to reduce the time s during which an instantaneous afterimage is generated.

Figure 15:
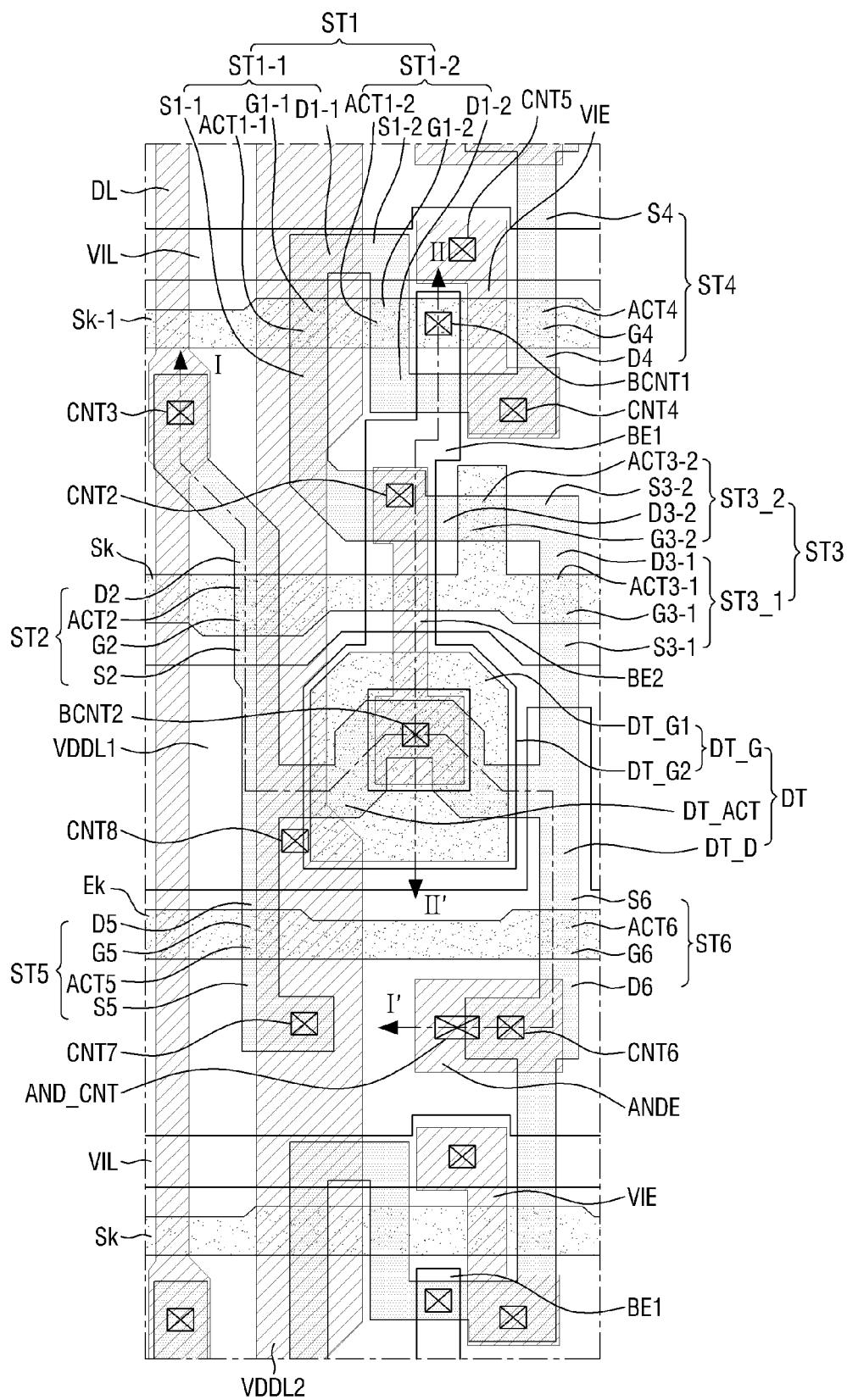
FIG. 15 is a plan view showing the subpixel according to some example embodiments.

FIG. 15 is a plan view showing the subpixel according to some example embodiments in more detail.

Referring to FIG. 15, the subpixel SP may include the driving transistor DT, the first to sixth transistors ST1 to ST6, and the capacitor C1.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT. The gate electrode DT_G of the driving transistor DT may include the first gate electrode DT_G1 and the second gate electrode DT_G2. The first gate electrode DT_G1 may be located on the active layer DT_ACT of the driving transistor DT, and the second gate electrode DT_G2 may be located below the active layer DT_ACT of the driving transistor DT.

The first gate electrode DT_G1 may be connected to a second connection electrode BE2 via a second connection contact hole BCNT2. The second connection electrode BE2 may be connected to a first electrode S1 of the (1-1)-th transistor ST1-1 via a second contact hole CNT2. The second connection electrode BE2 may cross the k-th scan line Sk.

The second gate electrode DT_G2 may be directly connected to a first connection electrode BE1. The second gate electrode DT_G2 and the first connection electrode BE1 may be formed of the same material on the same layer. The first connection electrode BE1 may be connected to the (k−1)-th scan line Sk−1 via the first connection contact hole BCNT1. The first connection electrode BE1 may overlap the second connection electrode BE2. The first connection electrode BE1 may cross the k-th scan line Sk.

The first electrode DT_S of the driving transistor DT may be connected to a first electrode S2 of the second transistor ST2. The second electrode DT_D of the driving transistor DT may be connected to a first electrode S3-1 of the (3-1)-th transistor ST3-1 and a first electrode S6 of the sixth transistor ST6.

The first transistor ST1 may be formed as a dual transistor. The first transistor ST1 may include the (1-1)-th transistor ST1-1 and the (1-2)-th transistor ST1-2.

The (1-1)-th transistor ST1-1 may include an active layer ACT1-1, a gate electrode G1-1, a first electrode S1-1, and a second electrode D1-1. The gate electrode G1-1 of the (1-1)-th transistor ST1-1 is a portion of the (k−1)-th scan line Sk−1 and may be an overlapping region in which the active layer ACT1-1 of the (1-1)-th transistor ST1-1 and the (k−1)-th scan line Sk−1 overlap each other. The first electrode S1-1 of the (1-1)-th transistor ST1-1 may be connected to the second connection electrode BE2 of the driving transistor DT via the second contact hole CNT2. The second electrode D1-1 of the (1-1)-th transistor ST1-1 may be connected to a first electrode S1-2 of the (1-2)-th transistor ST1-2.

The (1-2)-th transistor ST1-2 may include an active layer ACT1-2, a gate electrode G1-2, the first electrode S1-2, and a second electrode D1-2. The gate electrode G1-2 of the (1-2)-th transistor ST1-2 is a portion of the (k−1)-th scan line Sk−1 and may be an overlapping region in which the active layer ACT1-2 of the (1-2)-th transistor ST1-2 and the (k−1)-th scan line Sk−1 overlap each other. The first electrode S1-2 of the (1-2)-th transistor ST1-2 may be connected to the second electrode D1-1 of the (1-1)-th transistor ST1-1. The second electrode D1-2 of the (1-2)-th transistor ST1-2 may be connected to an initialization connection electrode VIE via a fourth contact hole CNT4.

The second transistor ST2 may include an active layer ACT2, a gate electrode G2, the first electrode S2, and a second electrode D2. The gate electrode G2 of the second transistor ST2 is a portion of the k-th scan line Sk (where k is a positive integer which is 2 or greater) and may be an overlapping region in which the active layer ACT2 of the second transistor ST2 and the k-th scan line Sk overlap each other. The first electrode S2 of the second transistor ST2 may be connected to the first electrode DT_S of the driving transistor DT. The second electrode D2 of the second transistor ST2 may be connected to the j-th data line Dj via a third contact hole CNT3.

The third transistor ST3 may be formed as a dual transistor. The third transistor ST3 may include the (3-1)-th transistor ST3-1 and the (3-2)-th transistor ST3-2.

The (3-1)-th transistor ST3-1 may include an active layer ACT3-1, a gate electrode G3-1, a first electrode S3-1, and a second electrode D3-1. The gate electrode G3-1 of the (3-1)-th transistor ST3-1 is a portion of the k-th scan line Sk and may be an overlapping region in which the active layer ACT3-1 of the (3-1)-th transistor ST3-1 and the k-th scan line Sk overlap each other. The first electrode S3-1 of the (3-1)-th transistor ST3-1 may be connected to a second electrode S3-2 of the (3-2)-th transistor ST3-2. The second electrode D3-1 of the (3-1)-th transistor ST3-1 may be connected to the second connection electrode BE2 via the second contact hole CNT2.

The (3-2)-th transistor ST3-2 may include an active layer ACT3-2, a gate electrode G3-2, the first electrode S3-2, and a second electrode D3-2. The gate electrode G3-2 of the (3-2)-th transistor ST3-2 is a portion of the k-th scan line Sk and may be an overlapping region in which the active layer ACT3-2 of the (3-2)-th transistor ST3-2 and the k-th scan line Sk overlap each other. The first electrode S3-2 of the (3-2)-th transistor ST3-2 may be connected to the second electrode DT_D of the driving transistor DT. The second electrode D3-2 of the (3-2)-th transistor ST3-2 may be connected to the first electrode S3-1 of the (3-1)-th transistor ST3-1.

The fourth transistor ST4 may include an active layer ACT4, a gate electrode G4, a first electrode S4, and a second electrode D4. The gate electrode G4 of the fourth transistor ST4 is a portion of the k-th scan line Sk and may be an overlapping region in which the active layer ACT4 of the fourth transistor ST4 and the k-th scan line Sk overlap each other. The first electrode S4 of the fourth transistor ST4 may be connected to an anode connection electrode ANDE via a sixth contact hole CNT6. An anode electrode AND of the light emitting element may be connected to the anode connection electrode ANDE via an anode contact hole AND_CNT. The second electrode D4 of the fourth transistor ST4 may be connected to the initialization connection electrode VIE via the fourth contact hole CNT4. The initialization voltage line VIL may be connected to the initialization connection electrode VIE via a fifth contact hole CNT5, and the initialization connection electrode VIE may be connected to the second electrode D3-2 of the (1-2)-th transistor ST1-2 and the second electrode D4 of the fourth transistor ST4 via the fourth contact hole CNT4. The initialization connection electrode VIE may be arranged to cross the k-th scan line Sk.

The fifth transistor ST5 may include an active layer ACT5, a gate electrode G5, a first electrode S5, and a second electrode D5. The gate electrode G5 of the fifth transistor ST5 is a portion of a k-th light emission control line ELk and may be an overlapping region in which the active layer ACT5 of the fifth transistor ST5 and the k-th light emission control line Elk overlap each other. The first electrode S5 of the fifth transistor ST5 may be connected to a (1-2)-th driving voltage line VDDL2 via a seventh contact hole CNT7. The second electrode D5 of the fifth transistor ST5 may be connected to the first electrode DT_S of the driving transistor DT.

The sixth transistor ST6 may include an active layer ACT6, a gate electrode G6, a first electrode S6, and a second electrode D6. The gate electrode G6 of the sixth transistor ST6 is a portion of the k-th light emission control line ELk and may be an overlapping region in which the active layer ACT6 of the sixth transistor ST6 and the k-th light emission control line ELk overlap each other. The first electrode S6 of the sixth transistor ST6 may be connected to the second electrode DT_D of the driving transistor DT. The second electrode D6 of the sixth transistor ST6 may be connected to the anode electrode AND of the light emitting element via the sixth contact hole CNT6.

A first electrode CE11 of the capacitor C1 is a portion of the second electrode DT_D of the driving transistor DT, and a second electrode CE12 of the capacitor C1 may be a (1-1)-th driving voltage line VDDL1 overlapping the second electrode DT_D of the driving transistor DT. The (1-1)-th driving voltage line VDDL1 may be connected to a (1-1)-th power voltage line VDDL1 via an eighth contact hole CNT8. The (1-2)-th driving voltage line VDDL2 may be arranged to be parallel to the j-th data line Dj, and the (1-1)-th driving voltage line VDDL1 may be arranged to be parallel to the k-th scan line Sk.

Figure 16:
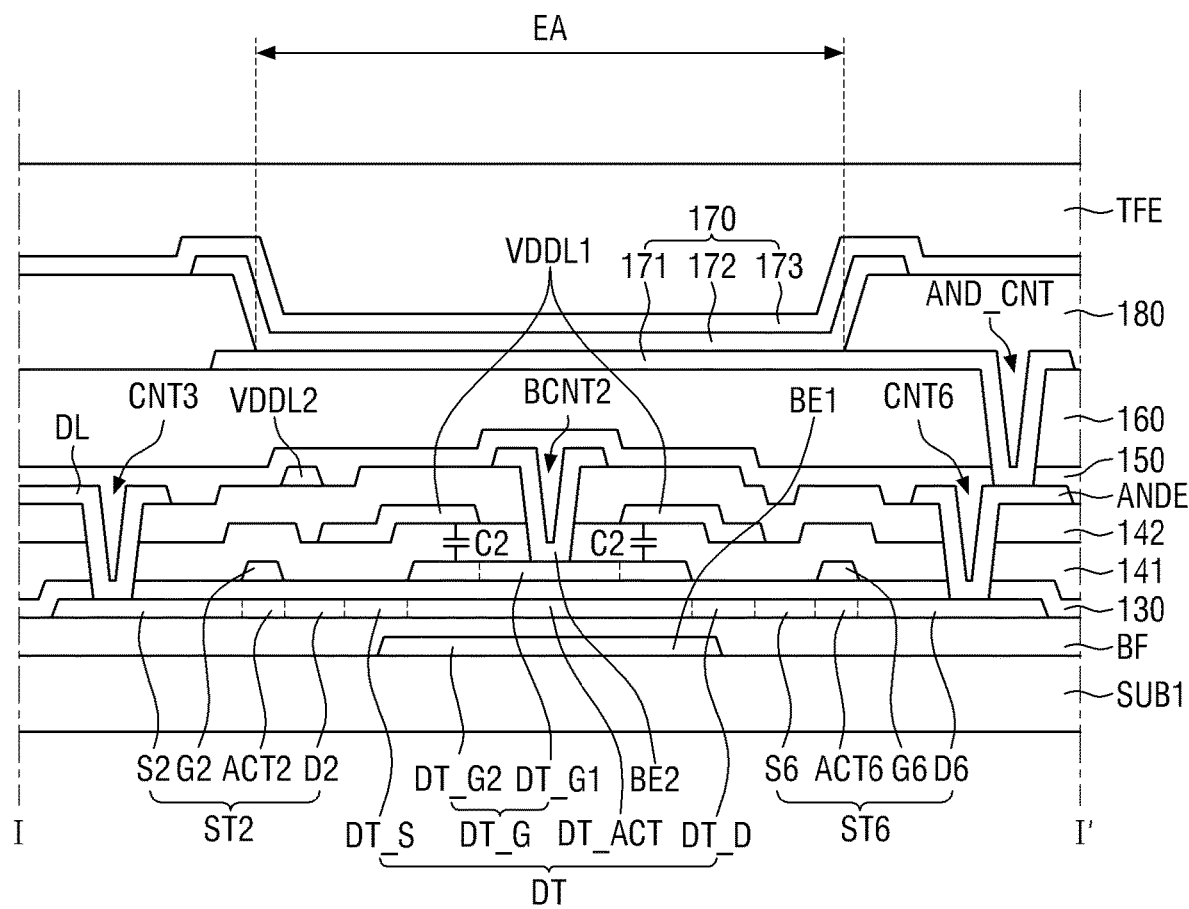
FIG. 16 is a cross-sectional view showing an example taken along the line I-I' of FIG. 15.
Figure 17:
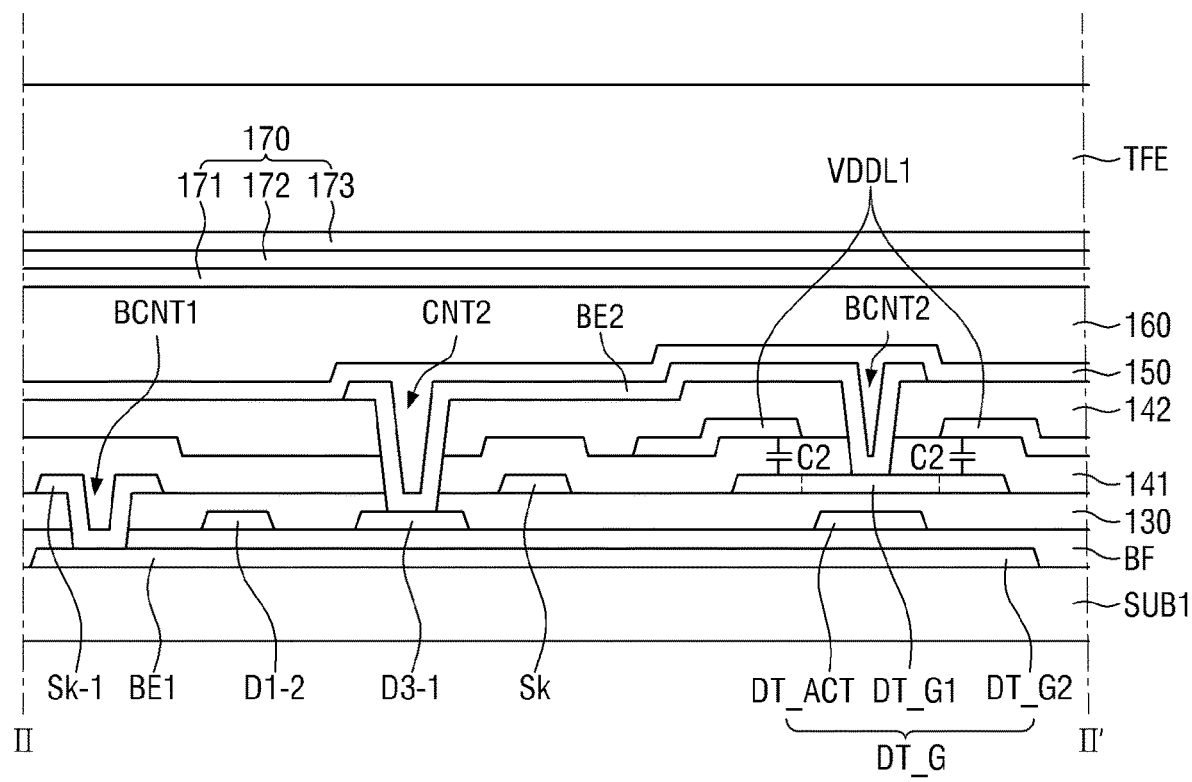
FIG. 17 is a cross-sectional view showing an example taken along the line II-II' of FIG. 15.

FIG. 16 is a cross-sectional view showing an example taken along the line I-I' of FIG. 15. FIG. 17 is a cross-sectional view showing an example taken along the line II-II' of FIG. 15.

Referring to FIGS. 16 and 17, a thin film transistor layer TFTL, a light emitting element layer EML, and an encapsulation layer TFE may be sequentially formed in that order on a first substrate SUB1.

The thin film transistor layer TFTL includes a light blocking layer BML, a buffer film BF, an active layer ACT, a first gate layer GTL1, a second gate layer GTL2, a data metal layer DTL, a gate insulating film 130, a first interlayer insulating film 141, a second interlayer insulating film 142, a protective film 150, and a planarizing film 160.

The light blocking layer BML may be formed on one surface of the first substrate SUB1. The light blocking layer BML may include the first connection electrode BE1 and the second gate electrode DT_G2 of the driving transistor DT. The light blocking layer BML may be formed of a single layer or a multi-layer formed of any one of molybdenum (Mo), aluminum (Al), chromium (Cr), gold (Au), titanium (Ti), nickel (Ni), neodymium (Nd), and copper (Cu) or an alloy thereof.

The buffer film BF may be formed on the light blocking layer BML. The buffer film BF may be formed on one surface of the first substrate SUB1 in order to protect thin film transistors 120 and an organic emissive layer 172 of the light emitting element layer EML from moisture permeating through the first substrate SUB1 which is vulnerable to moisture permeation. The buffer film BF may be formed of a plurality of inorganic films which are alternately stacked. For example, the buffer film BF may be formed of a multilayer film in which inorganic films of one or more of a silicon nitride layer, a silicon oxynitride layer, a silicon oxide layer, a titanium oxide layer, and an aluminum oxide layer are alternately stacked. The buffer film BF may be omitted.

The active layer ACT may be formed on the first substrate SUB1 or the buffer film BF. The active layer ACT may include polycrystalline silicon, monocrystalline silicon, low-temperature polycrystalline silicon, amorphous silicon, or oxide semiconductor. When the active layer ACT is formed of polycrystalline silicon, the active layer ACT doped with ions may have conductivity. Thus, the active layer ACT may include, not only active layers DT_ACT and ACT1 to ACT6 of the driving transistor DT and the first to sixth switching transistors ST1 to ST6, but also include the source electrodes DT_S, S1, S2-1, S2-2, S3-1, S3-2, S4, S5, and S6 and the drain electrodes DT_D, D1, D2-1, D2-2, D3-1, D3-2, D4, D5, and D6 thereof.

The gate insulating film 130 may be formed on the active layer ACT. The gate insulating film 130 may be formed of an inorganic film, e.g., a silicon nitride layer, a silicon oxynitride layer, a silicon oxide layer, a titanium oxide layer, or an aluminum oxide layer.

The first gate layer GTL1 may be formed on the gate insulating film 130. The first gate layer GTL1 may not only include the first gate electrode DT_G1 of the driving transistor DT and the gate electrodes G1 to G6 of the first to sixth switching transistors ST1 to ST6, but also include the scan lines Sk−1, Sk, and Sk+1 and the light emission control lines Ek. The first gate layer GTL1 may be formed of a single layer or a multi-layer formed of any one of Mo, Al, Cr, Au, Ti, Ni, Nd, and Cu, or an alloy thereof.

The first interlayer insulating film 141 may be formed on the first gate layer GTL1. The first interlayer insulating film 141 may be formed of an inorganic film, e.g., a silicon nitride layer, a silicon oxynitride layer, a silicon oxide layer, a titanium oxide layer, or an aluminum oxide layer. The first interlayer insulating film 141 may include a plurality of inorganic films.

The second gate layer GTL2 may be formed on the first interlayer insulating film 141. The second gate layer GTL2 may include the initialization voltage line VIL and the (1-1)-th driving voltage line VDDL1. The second gate layer GTL2 may be formed of a single layer or a multi-layer formed of any one of Mo, Al, Cr, Au, Ti, Ni, Nd, and Cu, or an alloy thereof.

The second interlayer insulating film 142 may be formed on the second gate layer GTL2. The second interlayer insulating film 142 may be formed of an inorganic film, e.g., a silicon nitride layer, a silicon oxynitride layer, a silicon oxide layer, a titanium oxide layer, or an aluminum oxide layer. The second interlayer insulating film 142 may include a plurality of inorganic films.

The data metal layer DTL may be formed on the second interlayer insulating film 142. The data metal layer DTL may include the data lines DL, the first power voltage lines VDDL1, the second connection electrode BE2, the anode connection electrode ANDE, and the initialization connection electrode VIE. The data metal layer DTL may be formed of a single layer or a multi-layer formed of any one of Mo, Al, Cr, Au, Ti, Ni, Nd, and Cu, or an alloy thereof.

The planarizing film 160 for planarizing steps formed due to the active layer ACT, the first gate layer GTL1, the second gate layer GTL2, and the data metal layer DTL may be formed on the data metal layer DTL. The planarizing film 160 may be formed of an organic film such as acryl resin, epoxy resin, phenolic resin, polyamide resin, and polyimide resin.

Meanwhile, the protective film 150 may be additionally formed between the data metal layer DTL and the planarizing film 160. The protective film 150 may be formed of an inorganic film, e.g., a silicon nitride layer, a silicon oxynitride layer, a silicon oxide layer, a titanium oxide layer, or an aluminum oxide layer.

The driving transistor DT and the first to sixth transistors ST1 to ST6 are illustrated in FIG. 8 as being formed as top gate transistors in which a gate electrode is located above an active layer, but note that embodiments are not limited thereto. That is, the driving transistor DT and the first to sixth transistors ST1 to ST6 may also be formed as bottom gate transistors in which a gate electrode is located below an active layer or formed as double gate transistors in which a gate electrode is located both above and below an active layer.

The first connection contact hole BCNT1 may be a hole which passes through the buffer film BF and the gate insulating film 130 and exposes the first connection electrode BE1 as illustrated in FIG. 17. The (k−1)-th scan line Sk−1 may be connected to the first connection electrode BE1 via the first connection contact hole BCNT1.

The second connection contact hole BCNT2 may be a hole which passes through the first interlayer insulating film 141 and the second interlayer insulating film 142 and exposes the first gate electrode DT_G1 of the driving transistor DT as illustrated in FIGS. 16 and 17. The second electrode BE2 may be connected to the first gate electrode DT_G1 of the driving transistor DT via the second connection contact hole BCNT2.

The second contact hole CNT2 may be a hole which passes through the gate insulating film 130, the first interlayer insulating film 141, and the second interlayer insulating film 142 and exposes the second electrode D3-1 of the (3-1)-th transistor ST3-1. The second connection electrode BE2 may be connected to the second electrode D3-1 of the (3-1)-th transistor ST3-1 via the second contact hole CNT2.

The third contact hole CNT3 may be a hole which passes through the gate insulating film 130, the first interlayer insulating film 141, and the second interlayer insulating film 142 and exposes the first electrode S2 of the second transistor ST2. The j-th data line Dj may be connected to the first electrode S2 of the second transistor ST2 via the third contact hole CNT3.

The fourth contact hole CNT4 may be a hole which passes through the gate insulating film 130, the first interlayer insulating film 141, and the second interlayer insulating film 142 and exposes the second electrode D1 of the first transistor ST1 and the second electrode D4 of the fourth transistor ST4. The initialization connection electrode VIE may be connected to the second electrode D1-2 of the (1-2)-th transistor ST1-2 and the second electrode D4 of the fourth transistor ST4 via the fourth contact hole CNT4.

The fifth contact hole CNT5 may be a hole which passes through the second interlayer insulating film 142 and exposes the initialization voltage line VIL. The initialization connection electrode VIE may be connected to the initialization voltage line VIL via the fifth contact hole CNT5.

The sixth contact hole CNT6 may be a hole which passes through the gate insulating film 130, the first interlayer insulating film 141, and the second interlayer insulating film 142 and exposes the second electrode D6 of the second transistor ST6. The anode connection electrode ANDE may be connected to the second electrode D6 of the sixth transistor ST6 via the sixth contact hole CNT6.

The seventh contact hole CNT7 may be a hole which passes through the gate insulating film 130, the first interlayer insulating film 141, and the second interlayer insulating film 142 and exposes the first electrode S5 of the fifth transistor ST5. The (1-2)-th driving voltage line VDDL2 may be connected to the first electrode S5 of the fifth transistor ST5 via the seventh contact hole CNT7.

The eighth contact hole CNT8 may be a hole which passes through the second interlayer insulating film 142 and exposes the (1-1)-th driving voltage line VDDL1. The (1-2)-th driving voltage line VDDL2 may be connected to the (1-1)-th driving voltage line VDDL1 via the eighth contact hole CNT8.

The anode contact hole AND_CNT may be a hole which passes through the protective film 150 and the planarizing film 160 and exposes the anode connection electrode ANDE.

The light emitting element layer EML is formed on the thin film transistor layer TFTL. The light emitting element layer EML includes light emitting elements 170 and a pixel defining film 180.

The light emitting elements 170 and the pixel defining film 180 are formed on the planarizing film 160. Each of the light emitting elements 170 may include a first electrode 171, the organic emissive layer 172, and a second electrode 173.

The first electrode 171 may be formed on the planarizing film 160. The first electrode 171 may be connected to the anode connection electrode ANDE via the anode contact hole AND_CNT passing through the protective film 150 and the planarizing film 160.

In a top emission structure in which light is emitted toward the second electrode 173 from the organic emissive layer 172, the first electrode 171 may be formed of a conductive material having high reflectance such as a laminated structure of Al and Ti (Ti/Al/Ti), a laminated structure of Al and indium tin oxide (ITO) (ITO/Al/ITO), an APC alloy, and a laminated structure of the APC alloy and ITO (ITO/APC/ITO). The APC alloy is an alloy of silver (Ag), palladium (Pd), and copper (Cu).

The pixel defining film 180 may be formed to divide the first electrode 171 on the planarizing film 160 in order to define light emitting area EA of each of subpixels SP1, SP2, and SP3. The pixel defining film 180 may be formed to cover an edge of the first electrode 171. The pixel defining film 180 may be formed of an organic film such as acryl resin, epoxy resin, phenolic resin, polyamide resin, and polyimide resin.

The light emitting area EA of each of the subpixels SP1, SP2, and SP3 indicates an area in which the first electrode 171, the organic emissive layer 172, and the second electrode 173 are sequentially laminated in that order and holes from the first electrode 171 and electrons from the second electrode 173 are combined with each other in the organic emissive layer 172 such that light is emitted.

The organic emissive layer 172 is formed on the first electrode 171 and the pixel defining film 180. The organic emissive layer 172 may include an organic material and emit light of a color (e.g., a set or predetermined color). For example, the organic emissive layer 172 may include a hole transporting layer, an organic material layer, and an electron transporting layer. The organic emissive layer 172 of the first subpixel SP1 may emit light of a first color, the organic emissive layer 172 of the second subpixel SP2 may emit light of a second color, and the organic emissive layer 172 of the third subpixel SP3 may emit light of a third color. Alternatively, the organic emissive layers 172 of the subpixels SP1, SP2, and SP3 may emit white light. In this case, the first subpixel SP1 may overlap a color filter layer of the first color, the second subpixel SP2 may overlap a color filter layer of the second color, and the third subpixel SP3 may overlap a color filter layer of the third color. In the present specification, for convenience of description, description will be given by assuming that the first color is red, the second color is green, and the third color is blue.

The second electrode 173 is formed on the organic emissive layer 172. The second electrode 173 may be formed to cover the organic emissive layer 172. The second electrode 173 may be a common layer which is commonly formed in the subpixels SP1, SP2, and SP3. A capping layer may be formed on the second electrode 173.

In a top emission structure, the second electrode 173 may be formed of a transparent conductive material (TCO) such as ITO and indium zinc oxide (IZO) or a semi-transmissive conductive material such as magnesium (Mg), Ag, or an alloy of Mg and Ag. When the second electrode 173 is formed of a semi-transmissive conductive material, light output efficiency may be improved by a micro-cavity.

The encapsulation layer TFE may be formed on the light emitting element layer EML. The encapsulation layer TFE may include at least one inorganic film in order to prevent permeation of oxygen or moisture into the light emitting element layer EML. Also, the encapsulation layer TFE may include at least one organic film in order to prevent the light emitting element layer EML from foreign substances such as dust.

Alternatively, a second substrate may be arranged, instead of the encapsulation layer TFE, on the light emitting element layer EML, and a space between the light emitting element layer EML and the second substrate may be empty in a vacuum or filled with a filler film. The filler film may be an epoxy filler film or a silicon filler film.

According to some example embodiments, as illustrated in FIGS. 15 to 17, the second gate electrode DT_G2 of the driving transistor DT may be connected to the (k−1)-th scan line Sk−1 via the first connection electrode BE1. The first connection electrode BE1 may be formed on the light blocking layer BML. Accordingly, the first connection electrode BE1 may cross the k-th scan line Sk, the second connection electrode BE2, the second electrode D1-2 of the (1-2)-th transistor ST1-2, and the second electrode D3-2 of the (3-2)-th transistor ST3-2 which are located between the (k−1)-th scan line Sk−1 and the second gate electrode DT_G2 of the driving transistor DT, and connect the (k−1)-th scan line Sk−1 and the second gate electrode DT_G2 of the driving transistor DT to each other.

According to some example embodiments of the present disclosure, because, by connecting a second gate electrode of a driving transistor to a (k−1)-th scan line, a voltage difference between a second gate electrode and a first electrode of a driving transistor DT can be controlled to be lower than a threshold voltage of the driving transistor when the driving transistor is biased on, driving current of the driving transistor can be increased. Accordingly, it is possible to reduce a luminance difference in a light emitting element which occurs due to the hysteresis characteristic of the driving transistor when the light emitting element displays black luminance and then displays white luminance.

Also, according to some example embodiments of the present disclosure, because the voltage difference between the second gate electrode and the first electrode of the driving transistor can be controlled to be higher than 0 V during a period in which the light emitting element emits light, the driving current curve of the driving transistor can be negatively shifted. Therefore, it is possible to reduce a shift of the driving current curve of the driving transistor which occurs due to the hysteresis characteristic of the driving transistor between when black luminance is displayed and when white luminance is displayed. Accordingly, it is not only possible to reduce a luminance difference in the light emitting element which occurs due to the hysteresis characteristic of the driving transistor when black luminance is displayed and then white luminance is displayed, but also possible to reduce the time during which an instantaneous afterimage is generated.

Further, according to some example embodiments of the present disclosure, the second gate electrode of the driving transistor may be connected to the (k−1)-th scan line through a first connection electrode. The first connection electrode may be formed on a light blocking layer. Accordingly, the first connection electrode may connect the (k−1)-th scan line and the second gate electrode of the driving transistor to each other by crossing a k-th scan line, a second connection electrode, a second electrode of a (1-2)-th transistor, and a second electrode of a (3-2)-th transistor which are located between the (k−1)-th scan line and the second gate electrode of the driving transistor.

The use of "may" when describing embodiments of the present invention refers to "one or more embodiments of the present invention." Also, the term "exemplary" is intended to refer to an example or illustration.

Although certain example embodiments and implementations have been described herein, other embodiments and modifications will be apparent from this description. Accordingly, the subject matter of embodiments according to the present disclosure are not limited to the example embodiments, but rather to the broader scope of the appended claims and their equivalents as would be apparent to a person of ordinary skill in the art.

What is claimed is:

1. A display device comprising:
   a first scan line and a second scan line which are parallel to each other;
   a data line crossing the first scan line and the second scan line;
   a subpixel connected to the first scan line, the second scan line, and the data line; and
   an initialization voltage line configured to receive an initialization voltage, wherein the subpixel includes:
a driving transistor configured to control a driving current flowing from a first electrode thereof to a second electrode thereof according to a data voltage applied to a first gate electrode thereof, the driving transistor having a second gate electrode connected to the first scan line and configured to receive a first scan signal of the first scan line;
a light emitting element configured to emit light according to the driving current; and
a first transistor configured to be turned on in response to the first scan signal wherein the first transistor is configured to connect the first gate electrode of the driving transistor to the initialization voltage line;
a second transistor configured to be turned on in response to a second scan signal of the second scan line, wherein the second transistor is configured to connect the first electrode of the driving transistor to the data line, and
wherein the second gate electrode of the driving transistor and a gate electrode of the first transistor are connected to the first scan line; and
wherein, during a first period in which the initialization voltage is applied to the first gate electrode of the driving transistor, a first level voltage of the first scan signal is applied to the second gate electrode, and
wherein, during the first period, the first level voltage of the first scan signal is lower than the initialization voltage.

2. The display device of claim 1, wherein the subpixel further includes:
a third transistor configured to be turned on in response to the second scan signal, wherein the third transistor is configured to connect the first gate electrode of the driving transistor to the second electrode of the driving transistor; and
a fourth transistor configured to be turned on in response to the second scan signal, wherein the fourth transistor is configured to connect a first electrode of the light emitting element to the initialization voltage line.

3. The display device of claim 2, further comprising:
a light emission line parallel to the first scan line and the second scan line; and
a first driving voltage line configured to receive a first driving voltage,
wherein the subpixel further includes:
a fifth transistor configured to be turned on in response to a light emission signal of the light emission line, wherein the fifth transistor is configured to connect the first electrode of the driving transistor to the first driving voltage line; and
a sixth transistor configured to be turned on in response to the light emission signal, wherein the sixth transistor is configured to connect the second electrode of the driving transistor to the light emitting element.

4. The display device of claim 1, wherein, during the first period, a voltage difference between the second gate electrode and the first electrode of the driving transistor is lower than a voltage difference between the first gate electrode and the first electrode of the driving transistor.

5. The display device of claim 1, wherein, during a third period in which the light emitting element emits light according to the driving current of the driving transistor, a second level voltage of the first scan signal is applied to the second gate electrode.

6. The display device of claim 5, wherein, during the third period, a voltage difference between the second gate electrode and the first electrode of the driving transistor is higher than a voltage difference between the first gate electrode and the first electrode of the driving transistor.

7. The display device of claim 1, further comprising a first connection electrode which connects the first scan line to the second gate electrode of the driving transistor.

8. The display device of claim 7, wherein the first connection electrode is on a same layer as the second gate electrode of the driving transistor.

9. The display device of claim 7, further comprising at least one insulating film between the first scan line and the first connection electrode.

10. A display device comprising:
a first scan line and a second scan line which are parallel to each other;
a data line crossing the first scan line and the second scan line;
a subpixel connected to the first scan line, the second scan line, and the data line; and
an initialization voltage line configured to receive an initialization voltage,
wherein the subpixel includes:
a driving transistor configured to control a driving current flowing from a first electrode thereof to a second electrode thereof according to a data voltage applied to a first gate electrode thereof, the driving transistor having a second gate electrode connected to the first scan line and configured to receive a first scan signal of the first scan line;
a light emitting element configured to emit light according to the driving current; and
a first transistor configured to be turned on in response to the first scan signal wherein the first transistor is configured to connect the first gate electrode of the driving transistor to the initialization voltage line,
wherein the second gate electrode of the driving transistor and a gate electrode of the first transistor are connected to the first scan line, and
wherein during a second period in which a data voltage of the data line is applied to the first gate electrode of the driving transistor, a second level voltage of the first scan signal is applied to the second gate electrode, and
wherein, during the second period, the second level voltage of the first scan signal is higher than the data voltage.

11. The display device of claim 10, wherein, during the second period, a voltage difference between the second gate electrode and the first electrode of the driving transistor is higher than a voltage difference between the first gate electrode and the first electrode of the driving transistor.

12. A display device comprising:
a first scan line and a second scan line which are parallel to each other;
a data line crossing the first scan line and the second scan line; and
a subpixel connected to the first scan line, the second scan line, and the data line,
wherein the subpixel includes:
a driving transistor configured to control a driving current flowing from a first electrode thereof to a second electrode thereof according to a data voltage applied to a first gate electrode thereof, the driving transistor having a second gate electrode connected to the first scan line and configured to receive a first scan signal of the first scan line; and
a light emitting element configured to emit light according to the driving current, and further comprising a first connection electrode which connects the first scan line to the second gate electrode of the driving transistor;
a buffer film on the first connection electrode and the second gate electrode of the driving transistor; and
a gate insulating film on the first gate electrode of the driving transistor.

13. The display device of claim 12, wherein the first scan line is on the gate insulating film.

14. The display device of claim 12, wherein the first scan line is connected to the first connection electrode via a first connection contact hole passing through the buffer film and the gate insulating film.

15. The display device of claim 12, wherein the subpixel further includes:
a second connection electrode connecting the second electrode of a first transistor to the first gate electrode of the driving transistor.

16. The display device of claim 15, wherein the first connection electrode and the second connection electrode overlap each other.

\* \* \* \* \*